United States Patent [19]

Funk et al.

[11] 4,253,111
[45] Feb. 24, 1981

[54] APPARATUS FOR BONDING LEADS TO SEMICONDUCTOR CHIPS

[75] Inventors: Ernest J. Funk, Cupertino; Russell Union, Ben Lomond; Margaret M. Pratt, San Jose, all of Calif.

[73] Assignee: GCA Corporation, Bedford, Mass.

[21] Appl. No.: 945,710

[22] Filed: Sep. 25, 1978

[51] Int. Cl.² ............................................. H04N 7/18
[52] U.S. Cl. .................................... 358/101; 364/491
[58] Field of Search ................ 358/101; 364/491, 488, 364/481

[56] References Cited

U.S. PATENT DOCUMENTS

| | | | |
|---|---|---|---|
| 3,643,018 | 2/1972 | Adler | 358/101 |
| 3,814,845 | 6/1974 | Hurlbrink | 358/101 |
| 3,903,363 | 9/1975 | Montone | 358/101 |
| 3,988,535 | 10/1976 | Hickman | 358/101 |

OTHER PUBLICATIONS

"Automatic CCTV Positioning System," IBM Tech. Disc. Bulletin, vol. 14, #8, (Jan. 1972), Duffy et al, pp. 2348-2350.

*Primary Examiner*—Robert L. Griffin
*Assistant Examiner*—Michael A. Masinick
*Attorney, Agent, or Firm*—Kenway & Jenney

[57] ABSTRACT

In the bonding apparatus disclosed herein, possible misalignment of a semiconductor chip at the work station is sensed by first optically scanning the workpiece using a video scanning head mounted on a common X-Y carriage with the bonding head. A zone signal is generated which defines, within the scanned area, a limited zone of consideration. The video signal is evaluated as a function of the zone signal to measure the extent of coincidence between the zone and a target area on the workpiece. The placement and dimensions of the zone are progressively adjusted responsive to the evaluation and in accordance with a search algorithm to locate at least two target areas on the workpiece and the bonding head is then traversed to adjusted target coordinates derived from the optically located target areas.

6 Claims, 16 Drawing Figures

APPARATUS FOR BONDING LEADS TO SEMICONDUCTOR CHIPS

BACKGROUND OF THE INVENTION

This invention relates to an automatic bonding machine and more particularly to such a machine in which a video scanning head, traversable with the bonding head, scans a workpiece to be bonded, such as a semiconductor chip, prior to bonding thereby to obtain a basis for adjusting bonding position coordinates.

In bonding systems developed heretofore, various schemes have been proposed for optically scanning the workpiece prior to performing the bonding operations and for correcting any misalignments which may be so determined. Typically the image of the semiconductor chip is, in effect, compared with a mask which represents the chip or selected features thereon. The chip is then moved in response to the signal so generated in a manner so as to reduce the misalignment to an acceptable level. Examples of such systems are disclosed in U.S. Pat. Nos. 3,679,820; 3,814,845; 3,899,634; and 3,903,363. The mechanical implementation of such systems, however, is relatively complex and is a source of maintenance problems as well as of high initial cost. Likewise, the control circuits for such systems have typically involved a large number of special purpose, hard-wired signal logic circuits and analog computational circuits for processing the measured information and effecting the desired motions in response thereto.

Among the several objects of the present invention may be noted the provision of an automatic bonding machine of improved throughput and accuracy; the provision of such a machine which is of simplified and highly reliable mechanical construction; the provision of such a machine which, to a high degree utilizes standard and general purpose control logic elements; the provision of such a machine which is easily set up; and the provision of such a machine which is reliable and which is of relatively simple and inexpensive construction. Other objects and features will be in part apparent and in part pointed out hereinafer.

SUMMARY OF THE INVENTION

Briefly, lead bonding apparatus of the present invention involves an X-Y carriage carrying both a bonding head and a video scanning head. A workpiece to be bonded is held at an essentially predetermined work location and the carriage is initially operated to position the video scanning head in general alignment with the work location. The video scanning head generates a video signal corresponding to the characteristics of the workpiece, target areas on the workpiece being distinguishable in brightness. Means are employed for generating a zone signal defining, within the scanned area, a limited zone of consideration. The video signal is evaluated as a function of the zone signal to measure the extent of coincidence between the zone and a target area traversed by the scan. The dimensions of the zone are progressively adjusted in response to the evaluation and in accordance with a predetermined search algorithm to locate at least first and second target areas and to determine the actual X-Y coordinates of those target areas. A series of adjusted bonding positions are calculated utilizing the actual coordinates of the optically located target areas and the carriage is then traversed to position the bonding head over the adjusted bonding position successively and, at each position, effecting lead bonding to the workpiece.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
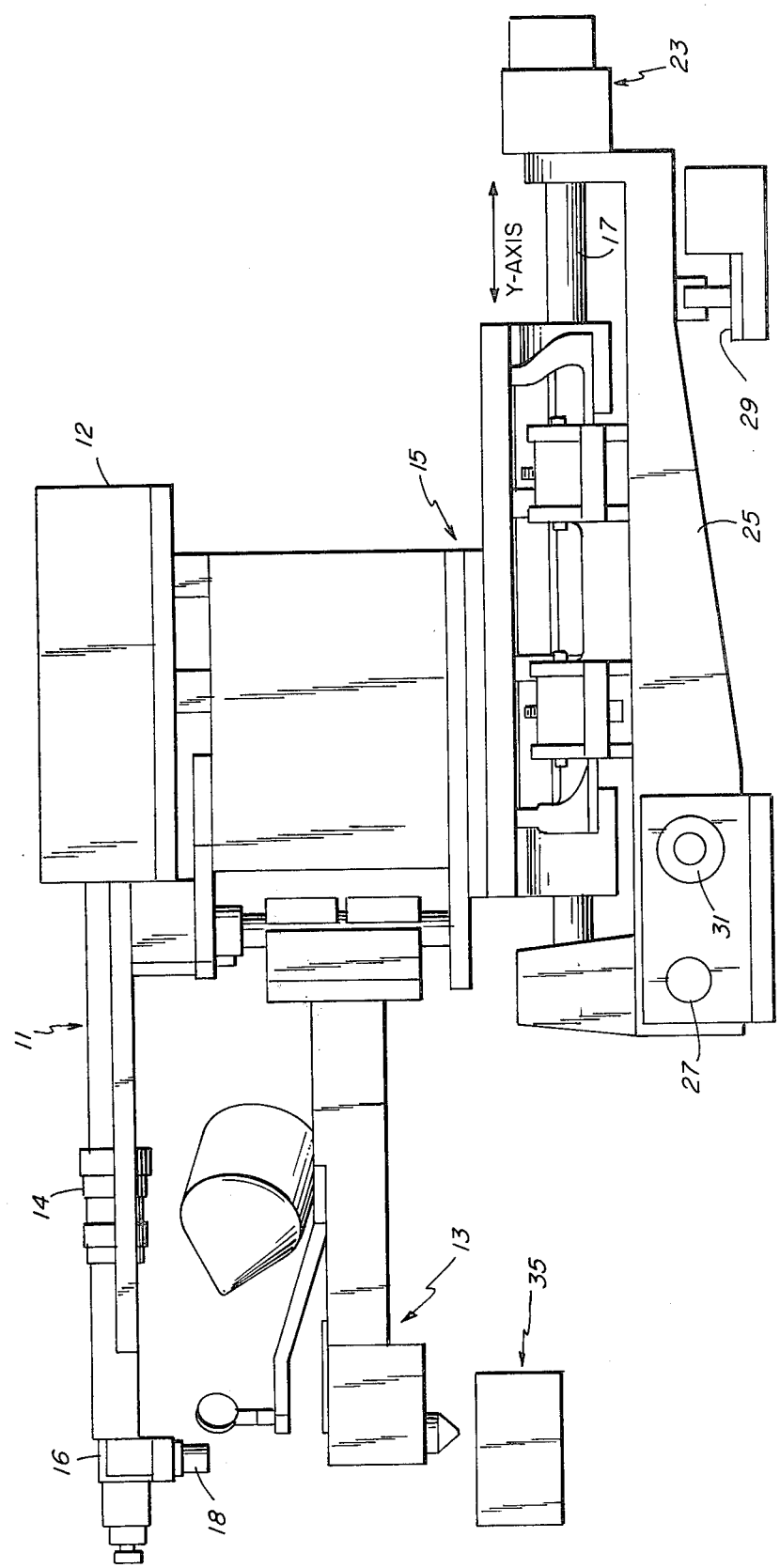
FIG. 1 is a side view of mechanical components employed in apparatus of the present invention, including an X-Y carriage carrying a bonding head and a video scanning head.
Figure 2:
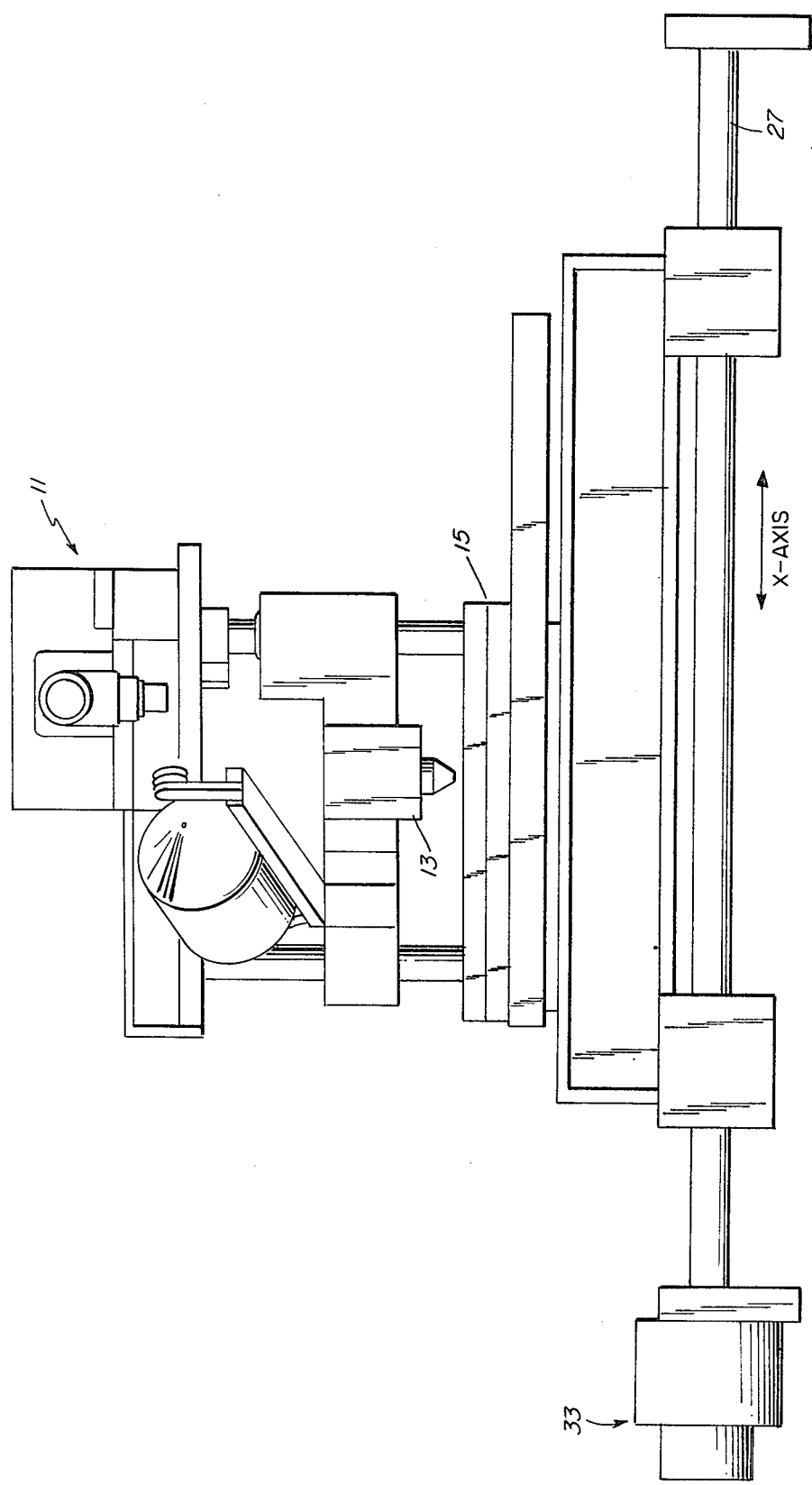
FIG. 2 is a front view of the mechanical components of FIG. 1.

In accordance with one aspect of the invention, the bonding apparatus disclosed herein employs an X-Y traversable carriage which carries both a bonding head and a video scanning head. In the embodiment illustrated, the X-Y plane is considered to be the horizontal plane. The X and Y axes are indicated in FIGS. 2 and 1 respectively. In FIGS. 1 and 2 the video scanning head is indicated generally by a reference character 11 while the bonding head is designated by reference character 13. Both of these elements are fixedly mounted in the X-Y plane with respect to a common base plate 15 which comprises the X-Y traversable portion of the carriage assembly. Video head 11 and bonding head 13 are thus maintained in a fixed relative location in the X-Y plane, though offset from each other. In the embodiment illustrated, this offset is principally along the X-axis.

Base plate 15 is slidable in one direction, designated the Y-axis along ways 17. Movement along the Y-axis is controlled by means of a lead screw (view obscured) which is in turn driven by a stepping motor and rotary encoder assembly 23. The Y-axis ways 17 are in turn mounted on an intermediate frame 25 which is in turn slidable along an orthagonal axis, designated the X-axis, on a cylindrical way 27 together with a flat way 29. Movement of the intermediate frame 25 is in turn controlled by a lead screw 31 which is in turn driven by a respective stepping motor and encoder assembly 33.

As will be understood by those skilled in the art, the stepping motors 23 and 33 together with their respective lead screws, provide a means for precisely positioning the carriage assembly, including the video head 11 and the bonding head 13, within the X-Y plane. In particular, the base plate 15 may be controllably traversed to bring either the video head 11 or the bonding head 13 over a work station, designated generally by reference character 35. Work station 35 is preferably provided with conventional means for feeding workpieces through the system, e.g. including an input magazine, a lateral transport mechanism for stepping workpieces across the work station, and output magazine.

Figure 3:
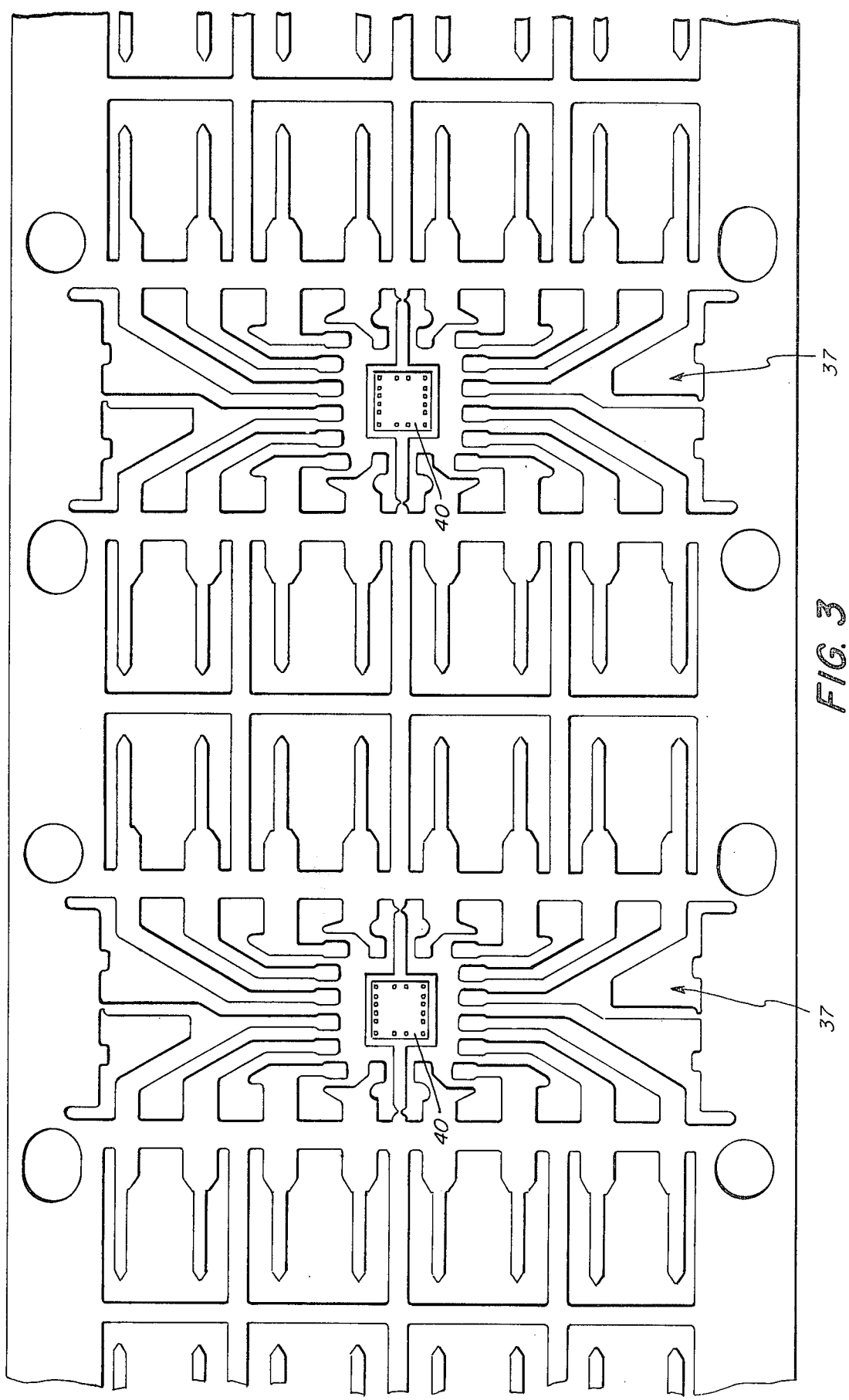
FIG. 3 is a plan view of a semiconductor lead frame strip, a typical workpiece being operated on the apparatus of this invention.

A typical workpiece, illustrated somewhat diagrammatically in FIG. 3, is a stamped metal strip comprising a series (typically 10) of individual lead patterns 37 with a semiconductor chip 40 bonded to the central portion of each lead pattern. As is understood by those skilled in the art, each lead pattern 39 comprises a plurality of individual leads or pins which, at this point in the overall semiconductor manufacturing operation are still attached to an overall frame. The function of the lead bonding apparatus of the present invention is to connect each of the individual leads or pins to a corresponding metallized pad on the semiconductor chip with a gold or aluminum wire. After these connections are made, the chip is encapsulated in plastic which also serves to secure the inner end of the individual lead pins and then the assembly is cut from the frame and the individual lead pins are shaped to form the standard dual-in-line plastic (DIP) circuit package which is an industry standard.

The particular type of bonding performed, e.g., thermo-compression, forms no part of the present invention and is thus not described in detail. However, whatever tye of bonding is utilized, the bonding head must be precisely positioned during bonding to the semiconductor chip in order that the bonding tip contact the desired pad rather than some other point on the chip surface. A high degree of accuracy is required since it is desired to keep the bonding pads as small as possible.

The task of hitting the bonding pads on the chip is further complicated by the fact that the chip may not be precisely located on the lead frame. Thus, no matter how accurately the lead frame is positioned by the feed mechanism, the individual semiconductor die will not be located with sufficient precision to permit the pads on the die to be located by the bonding head if operated empirically, i.e. under open loop control.

In accordance with the practice of the present invention, the video scanning head is first brought to a reference position over the work station prior to the initiation of any bonding and the semiconductor chip is scanned to generate a video signal corresponding to the characteristics of the chip's surface. This signal is evaluated in accordance with techniques described hereinafter to locate at least a pair of target areas on the chip, e.g. bonding pads, and to determine their actual X-Y coordinates. A set of adjusted bonding coordinates are then calculated using the actual X-Y coordinates of the located target areas which adjusted coordinates correspond with the requisite accuracy to the actual location of the bonding pads on the semiconductor chip relative to the fixed work station. Accordingly, the carriage can be traversed so as to position the bonding head successively over these adjusted coordinate positions and to accurately hit the bonding pads on the semiconductor chip, even though the chip may be somewhat randomly misaligned with respect to the lead frame.

As illustrated, the video head 11 includes a standard video camera body 12, a focus lens 14, a mirror assembly 16 for directing the camera's view downwardly, and an objective lens 18. The optics are preferably configured so that the field of view of the video scan corresponds essentially to the size of the expected semiconductor chips or to a major portion thereof. As is understood by those skilled in the art, the geometry of the surface of the semiconductor circuit itself is quite precisely defined by the nature of the manufacturing process. Accordingly, if a pair of reasonably separated points or features on the chip are located, the coordinates of essentially any feature on the chip may be accurately calculated.

Figure 4:
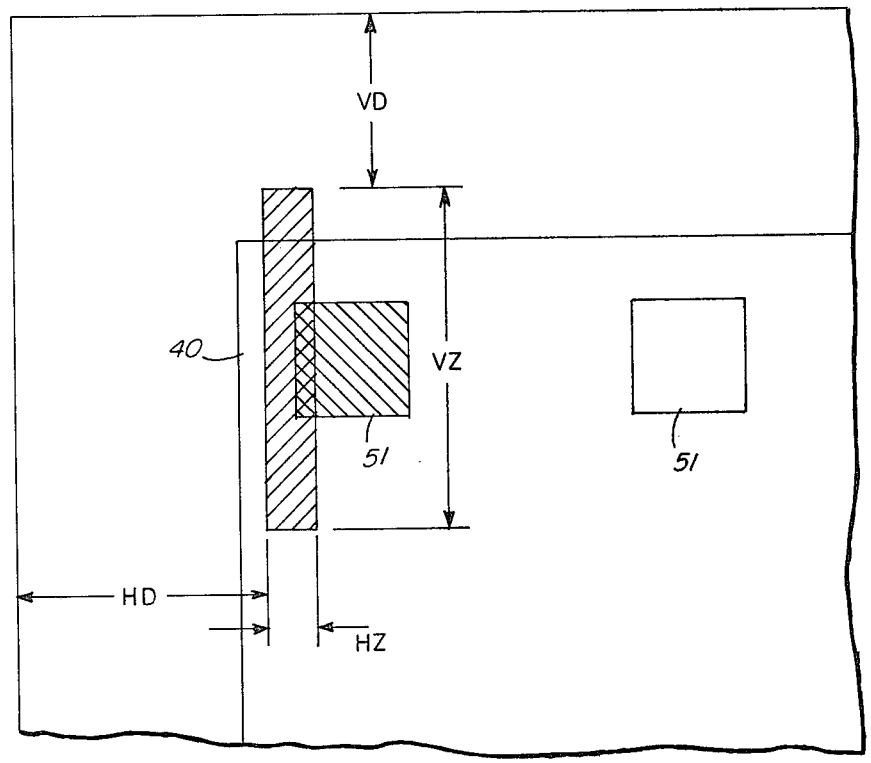
FIG. 4 represents the video scan of a portion of a single lead frame and part of a semiconductor chip carried thereby.

In FIG. 4 a portion of a typical scan is illustrated, the scan covering one corner of a semiconductor chip 40 including several bonding pads 51. As is also understood, the pads 51 are typically metallized as a part of the circuit manufacture and are thus readily distinguishable in terms of relative brightness level in the resultant video signal obtained from the camera. It should be understood, however, that other target areas may be used in accordance with the practice of the present invention, it being necessary only that they be distinguishable in brightness and that they may be either lighter or darker than adjacent portions of the chip surface.

Rather than employing a mask of fixed spatial characteristics, the location scheme employed by the present apparatus utilizes a variable zone system for evaluating the information obtained by the video scanning head. In this connection, the apparatus incorporates means for generating a zone signal which defines, within the scanned area, a limited zone of consideration. An evaluation is then made, based upon a composite of the zone signal and the video signal, to measure the extent of coincidence between the zone and the target area as determined by its distinguishable brightness level. In FIG. 4 the zone of consideration is represented by the shaded are superimposed on the image of the lead frame and semiconductor chip and the area over which this coincidence occurs is indicated by cross-hatching.

Figure 5:
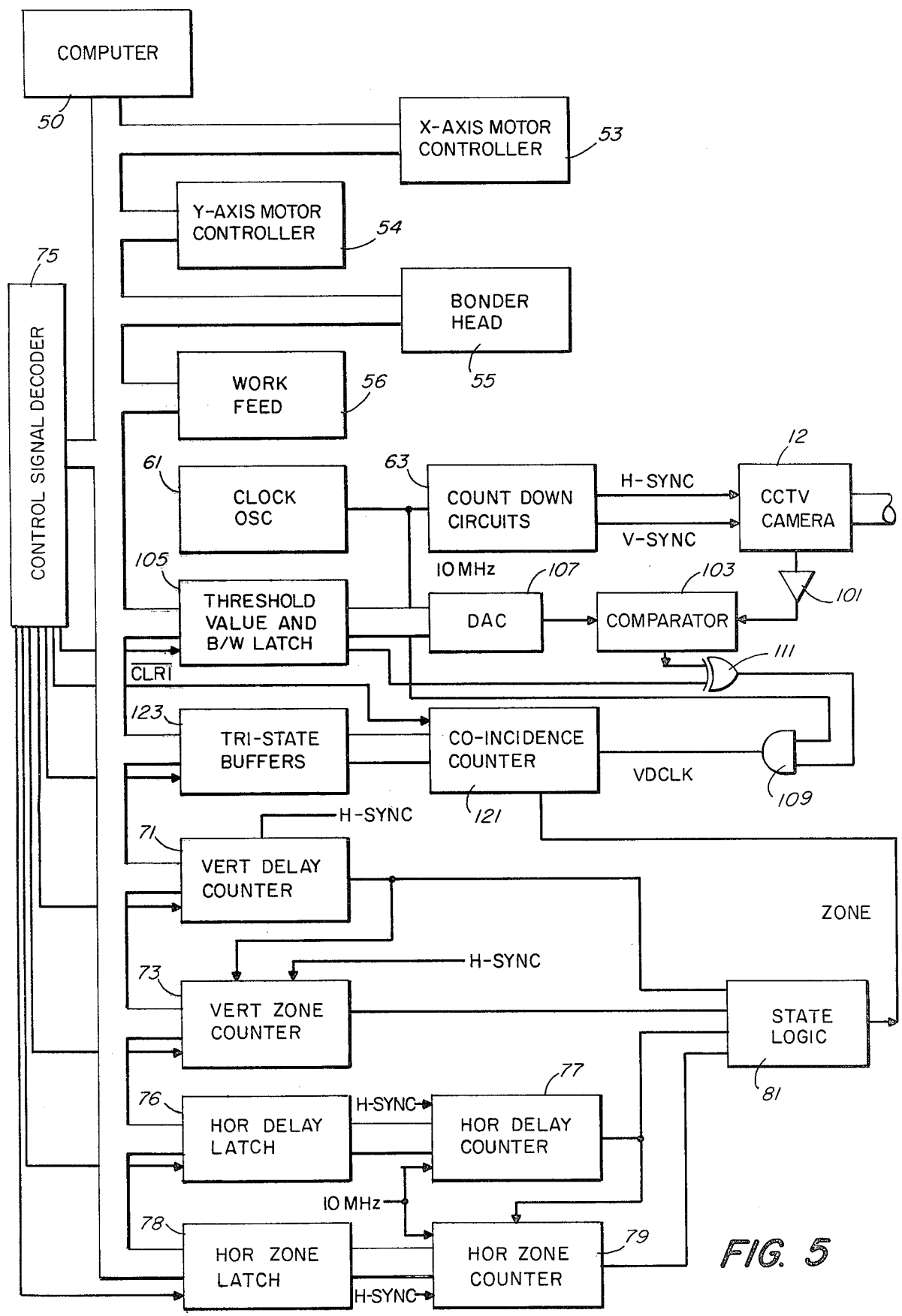
FIG. 5 is a block diagram of electronic control apparatus cooperating with the mechanical components illustrated in FIGS. 1 and 2.

The bonder apparatus of the present invention is arranged for operation under computer control, e.g. a minicomputer or so-called micro-computer, using a conventional common data bus configuration for communication with peripheral devices. In FIG. 5, the computer itself is indicated by reference character 50 while the data bus is indicated by reference character 51. X-axis and Y-axis motor controllers 53 and 54 are provided for controlling the energization of the stepping motors 33 and 32, respectively. The preferred type of motor controller is the servo type in which new coordinates may be entered into designation registers in the respective controllers by the computer and the controller itself will then effect appropriate energization of the stepping motor windings to drive the carriage to its destination, employing feedback based on the stepping motors' rotory encoder to optimize the acceleration and deceleration characteristics. Such controllers are known in the art and are thus not described in detail herein. Similarly, bonder head sequencers and workfeed devices are well known in the art and will differ from one application to the next. As these components are likewise not germaine to the present invention, they are not described in detail but are merely indicated generally by reference characters 55, 56 in FIG. 5.

In order to obtain exact coordinates which may be fed to the X and Y axis motor controllers for precisely positioning the bonder head 13 with respect to each of the pads on a semiconductor chip which is to be bonded, the apparatus of the present invention employs video search electronics, indicated generally by reference character 57 in FIG. 5, which, together with the video scanning head 11, allow target areas on a workpiece to be precisely located.

In order to synchronize the operation of the video camera 12 with the various search and counting operations described hereinafter, a common time base is estibished by means of a high frequency oscillator 61. Oscillator 61 provides a base timing signal, e.g. at 10 megahertz, which is counted down, as indicated at 63, to provide horizontal and vertical synchronizing pulses, H-SYNC and V-SYNC, respectively, which are provided to the camera 12. The location and dimensions of the zone under consideration are defined by four values or parameters which are loaded into corresponding registers or counters by the computer. These four values are designated vertical delay (VD), vertical zone (VZ), horizontal delay (HD) and horizontal zone (HZ). As indicated in FIG. 4, the vertial delay corresponds to the distance between the top of the scan and the top of the zone, while the vertical zone value corresponds to the vertical height of the zone itself. Similarly, the horizontal delay corresponds to the distance from the left edge of the scanned area to the zone while the horizontal zone value corresponds to the width of the zone itself. The zone signal is in effect a gating signal which merely indicates when the raster scan of the camera is within the zone under consideration. The vertical delay value is simply loaded by the computer directly into a counter 71 which then counts down on the basis of the horizontal sync pulses to determine when the zone has been entered. Likewise, the vertical zone value can be loaded into a similar counter 73 which also counts down the horizontal sync pulses to determine when the zone has been passed in the vertical dimension. As these counters go through only one cycle in a field, they are conveniently loaded directly by the computer since only one loading per field is needed. Control signals for causing the counters to be preset to the values specified by the computer are obtained by decoding address line signals provided by the computer in conventional manner. The decoding circuitry, which may be implemented by either gate arrays or read-only memory, is indicated generally by reference character 75.

Once the zone has been reached in the vertical dimension it can be seen that the scan passes into and out of the zone once during each line of the raster. Accordingly, for each of the horizontal values, it is convenient that the computer load a latch or register, once for each field and that that value be transferred to a counter once for each line. Thus, there is a horizontal delay latch 76 as well as a horizontal dely counter 77 and a horizontal zone latch 78 as well as a horizontal zone counter 79 to which the latched value is transferred once at the start of each line. Both horizontal counters count down from the ten megahertz clock signal. The horizontal delay counter indicates when the zone has been reached from the left edge of the frame, while the horizontal zone counter determines when the right-hand edge of the zone has been reached on each line.

Summarizing the operation thus far, the vertical delay counter 71 provides a signal indicating that the raster has reached a line where the raster will encounter the zone under consideration. At this point, the vertical zone counter 73 is enabled and provides a signal indicating that, in the vertical dimension, the raster is within the zone. On each line, the horizontal delay counter is loaded and then caused to count down the high frequency clock which, in effect, represents dot positions to determine when the raster enters the zone along the horizontal axis. At this point, the horizontal zone counter 79 is enabled and counts down so as to provide a signal indicating when the raster is within the horizontal boundaries of the zone. The signals from the four counters are combined in appropriate state logic circuitry 81 to generate a signal which indicates when the raster is actually within the zone, e.g. in both the horizontal and vertical dimensions. This latter signal is designated ZONE.

The video signal from camera 12, after passing through a buffer amplifier 101 is applied to a comparator 103 for determining whether the brightness level is above or below a preselected reference level applied to the other input of the comparator. The reference level is preferably freely preselectable and adjustable (i.e., under software control) and, accordingly is obtained by means of a register or latch 105 which can be loaded from the computer data bus 51. In addition to a binary value which represents the desired brightness threshold value, the latch 105 also holds one bit which indicates whether a "brighter than" or "darker than" criteria is to be applied to distinguish the target. This signal is designated B/W. The digital brightness value held by the latch is in turn converted, by digital-to-analog converter (DAC) 107, to a voltage level appropriate for applying to the comparator input. The binary output signal from the comparator 103 is combined in an AND gate 109 with the ten megahertz clock signal. The output from comparator 103 thus indicates when the video signal is above the reference value. The output signal from the comparator may be selectively complemented or not by means of an exclusive (XOR) gate 111, the other input to this gate being the B/W signal. XOR gate 111 allows the threshold test signal to be selectively complemented, i.e. to permit the system to run black on white as well as white on black, the latter being the more common mode when bonding to metallized pads as described herein.

The output signal from the XOR gate 111 is combined in an AND gate 109 with the 10 MHz. clock signal. This yields a gated clock signal, i.e. one in which clock pulses are present when the video signal meets the brightness criteria established by the data in the Threshold Value and the B/W Latch 105. Assuming the threshold value is appropriately set, clock pulses will be present on this signal line whenever the raster is crossing target areas, i.e. metallized bonding pads 51 on a semiconductor chip 40. This gated clock signal is designated VDCLK.

To evaluate the video gated clock signal to obtain a measure of the extent of coincidence between the zone and target areas, the apparatus employs a programmable counter 121 which is selectively enabled by the ZONE signal, and which counts the gated clock signal (VDCLK). The counter 121 can be reset under software control as indicated by the signal CLR1, the counter normally being reset at the start of each frame. The counter is then enabled while the video raster scan is traversing the limited zone under consideration and, while enabled, counts the gated clock signal (VDCLK), which represents target area thereby to obtain a measure of target area which is within the zone.

The counter 121 is coupled to the bus 151 through conventional tri-state buffers 123 so that the value obtained can be read out by the computer and can be utilized in connection with the search algorithm. While it is presently preferred that a separate count be run for each video frame, it should be understood that higher resolution can be obtained when the count is accumulated over several fields. Such a modification can be accomplished merely by software changes so long as sufficient capacity is provided in the counter 121.

Since the four parameters which determine the size and location of the zone under consideration may be freely selected under computer control, it may be seen that the zone may be moved and/or shaped at will. Thus, the zone can be progressively altered and moved under the control of a search algorithm which, in turn, alters its behavior in response to sensed conditions, i.e. the extent of coincidence between the zone under consideration and target area. One such algorithm is described hereinafter although it will be apparent to those skilled in the art that many such algorithms may be conceived and implemented using the apparatus of the present invention since the implementation of the algorithm entails only changing the operating program of the computer controlling the apparatus. This flexibility and adaptability of the system is made possible by the sensing and evaluation techniques implemented in the apparatus.

While the following description of the search procedure assumes that the chip is sufficiently well positioned initially to start looking for a target which is a metallized pad, it should be understood that a simpler or larger target could be sought out initially, e.g. a border or other larger feature on the chip. In this way, information can be obtained which is useable to narrow the initial pad search region.

Figure 6:
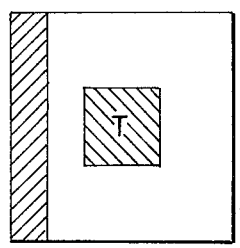
FIGS. 6–14 again represent a portion of the video scan, illustrating steps of a search algorithm which may be performed by the apparatus.
Figure 7:
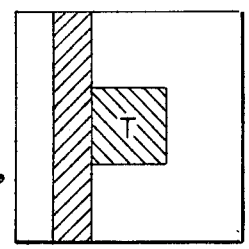
Figure 8:
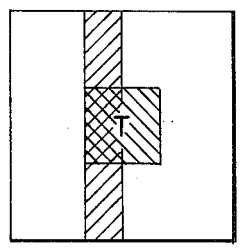
Figure 9:
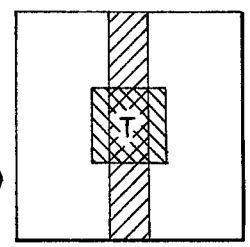
Figure 10:
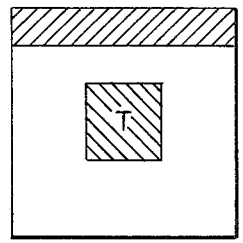
Figure 11:
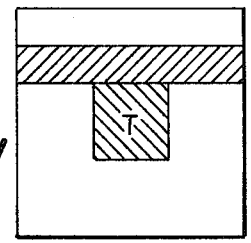
Figure 12:
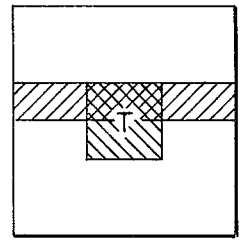
Figure 13:
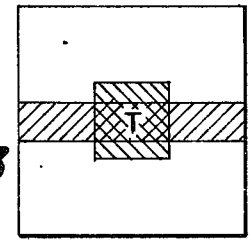

FIGS. 6 through 14 illustrate a search algorithm utilizing the controllable zone shown and described above. Successive figures may, for example, be understood as representing the evaluations done on successive video frames. A smaller portion of the overall video field is illustrated than that shown in FIG. 4, but the portion used is of a region which may be expected to include a target area, e.g., a metallized pad 51, on the semiconductor chip 40. Initially, the parameter registers defining the zone are loaded with values producing a tall, narrow zone located at the left-hand portion of the region as illustrated in FIG. 6. Assuming, as illustrated, that this zone does not encompass any of the target area, the counter 121 will not be advanced and this fact can be ascertained by the computer in reading the counter. The zone is then progressively shifted to the right on succeeding frames and the counter read at the end of each such raster scan. While the zone may, in this way, be traversed completely across the region so that the value read out rises to a maximum as the target area is traversed and then falls back to zero, the pad dimensions are usually well enough known so that this progression can be terminated by the algorithm as soon as the value read indicates that the then current zone passes squarely through the target area, e.g., as illustrated first in FIG. 8. In this way, the lateral position of the pad is determined.

Under program control a shallow flat zone is then outputted along the top edge of the region being investigated and this zone is progressively moved downwardly as illustrated in FIGS. 10-13, the counter 121 being again read after each field so that a value is obtained and stored representing the extent of coincidence between the zone and the target area traversed by the raster scan. As with the horizontal traversing, the vertical traversing of the zone provides a record which contains sufficient information for the algorithm to determine the actual coordinates of the pads. Likewise the traversing of the zone downwardly can be terminated once the value obtained indicates that the zone passes through the expected target area or the traversing can be continued across the entire region so as to seek a maxima.

Figure 14:
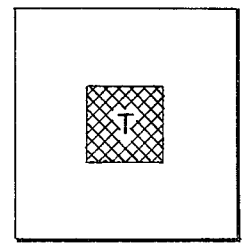

While the steps described thus far effectively locate the left and top edges of the target or of a referencing corner with adequate precision for most applications, a further refinement can be obtained by generating a zone having dimensions essentially matching those of the expected target and located where the target is now thought to be based on the abovedescribed search. This is illustrated in FIG. 14. The extent of coincidence is then evaluated, i.e. by means of the counter 121, to determine if the location is sufficiently accurate. If it is desired to further perfect the location, this zone may be shifted by minor amounts on both the vertical and horizontal axes until a best fit is obtained. By minor amounts is meant shifts that are small in relation to the total target widths.

In setting the count thresholds which are taken as indicating the presence of the desired target, it should be understood that the search algorithm will typically make some allowance for the fact that not all points on the target may in fact contribute to the count and that some adjacent features may in fact contribute to the count even though they are not part of the desired target. For each new type of workpiece, clearly some trial and error will be employed in setting the criteria of acceptance and these criteria may initially be established on either a percentage or absolute value basis.

Having located one bonding pad on the semiconductor chip with the requisite precision, it is typically appropriate to proceed to similarly locate a second bonding pad at a position which is substantially spaced across the face of the chip. By thusly locating two targets, the position and orientation of the entire chip will be adequately defined, since the relative geometry of features on the semiconductor chip is fixed with a high degree of precision by the usual manufacturing process.

Given the relative locations of all of the pads on the particular type of chip being processed, the computer can calculate corrected coordinates for each of these pads, using as a basis of correction the locations of the two targets whose locations were precisely determined by the video search algorithm. Once corrected coordinates have been calculated for all of the pads, the computer can direct the X and Y axis motor controllers to drive the bonding head to each pad location in turn and can effect a wire bonding operation for connecting that pad to the corresponding lead in the lead frame.

Figure 15A:
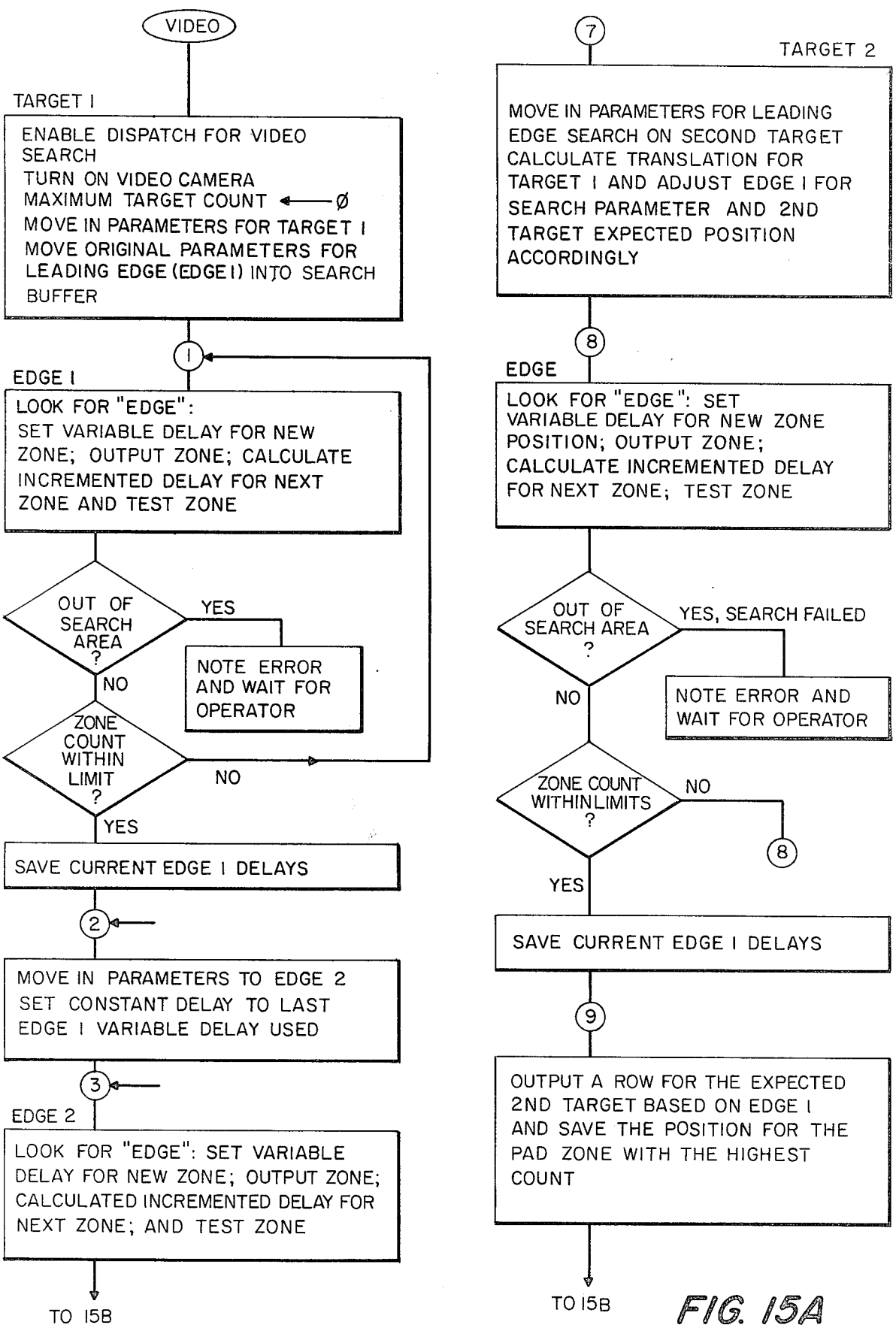
FIG. 15 is a flow chart of a computer program performing such a search algorithm.
Figure 15B:
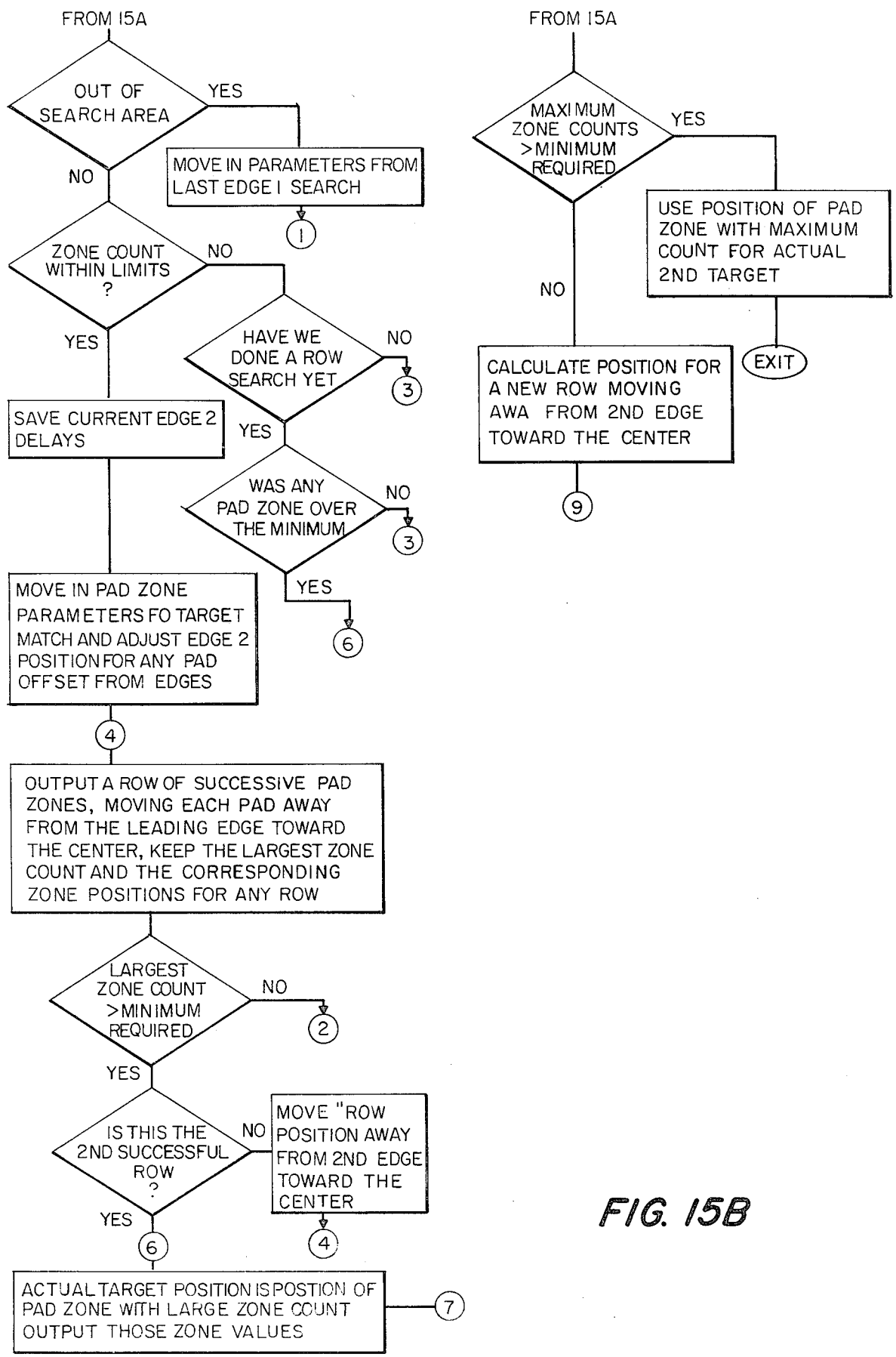

After bonding a wire lead to a pad, the bonder head will then string the wire and bond it to the corresponding lead or pin in the lead frame. The lead frame pins themselves represent such large targets that it is not necessary to establish corrected coordinates in order to accurately hit these targets with the bonding head. As will be understood, the routine for traversing the carriage and effecting the bonding will be stored as part of the operating routine system of the computer and will typically be changed for each type of semiconductor product which is to be bonded. As to the search algorithm, a flow chart for the computer program implementing the algorithm in a preferred embodiment is given in FIGS. 15a and 15b.

As Appendix I to this application, there is attached a program listing corresponding to this flow chart. This listing is presented in the Intel 8080 assembly language which is an accepted standard in the micro-computer industry. As Appendix II to this application, there is attached a set of circuit diagrams for the video search electronics indicated generally by reference character 57. In this implementation, dual limited zones of consideration were provided so that two bonding pads on a semiconductor chip could be searched out simultaneously. Likewise, the coincidence evaluations electronics are replicated. Thus, many of the elements found in FIG. 5 find duplicates in this detailed circuitry. As the details presented in Appendix II is not believed to contribute to an understanding of the invention itself, as contrasted with a particular detailed embodiment thereof, it is expected that Appendix II will be cancelled after filing of the application. It is belived useful that these materials remain as part of the application file but not that they appear as part of the printed patent.

While the pins on a lead frame represent such a large target that it is typically unnecessary to calculate corrected coordinates, a different situation may exist when semiconductor chips are incorporated into hybrid systems or other package forms utilizing ceramic substrates. In dense package configurations, these substrates may employ bonding pads which are also of relatively small dimensions. An advantage of the system of the present invention is that it may be utilized to locate these targets as well. Thus, corrected coordinates can be calculated for the bonds at both ends of each lead.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

APPENDIX I

```
LOC OBJ     SEQ       SOURCE STATEMENT

1  $MACROFILE
             2  $MACRODEBUG
             3
             4  NAME    BNVID
             5
             6  PUBLIC  BNVID, DVID
             7
             8  PUBLIC  VCAMON, VCAMOF
             9  PUBLIC  DLTX, DLTY, VX, VY, PDX, PDY
            10  PUBLIC  VZONES, VSPFL, VIDEO, SHOBOX
            11  PUBLIC  VRTCL, HZNTL, TARGET, VOUTH, VOUTV
            12  PUBLIC  VEDGE, PADLY, PADZN, PADMN, PADOFF, PADMX
            13  PUBLIC  REDLY, CONDLY, AEDGE, BOXSID, LDEDG
            14  PUBLIC  VWAIT, INIVIO, VFIND, GETBOX, DSPZON
            15  PUBLIC  VCENTR, DCHORZ, DCVERT
            16
            17
            18  EXTRN   VSBIT1, VSBIT2, VSBIT
            19  EXTRN   OCAMRA, VIDCAM, SURVEY
            20  EXTRN   CKTINC, MTOV
            21  EXTRN   VHTEN, VVTEN, VHCEN, VVCEN
            22  EXTRN   VINTHS, VCMDLY
            23  EXTRN   BOX1, BOX2
            24  EXTRN   PDX1, PDY1, PDX2, PDY2, SDX1, SDY1, SDX2, SDY2
            25  EXTRN   DLTX1, DLTY1, DLTX2, DLTY2
            26
            27  EXTRN   EVDCOD, VIDEV, ASSIST
            28  EXTRN   SYSTEM, SYVID, SYAUT, SETEVT
            29  EXTRN   WRITE, MODEIN, MODEOU, IODATA, IOACK
            30  EXTRN   MOVE, DSUB, DHALF, SDVRN, HCMPD, GETPCT
            31  EXTRN   DNEG, ABSHD
            32  EXTRN   WAIT, VCTL, VSRV
            33
            34
            35
            36
            37  $EJECT
```

```
LOC  OBJ        SEQ         SOURCE STATEMENT

= 38  $INCLUDE(:F1:BNDEF.VID)
              = 39  $TITLE('BNDEF.VID            16 NOV,1977')
              = 40
              = 41
              = 42  ;BNDEF.VID       VIDEO BUFFER INDEX DEFINITIONS
              = 43
              = 44
              = 45  ASEG
              = 46
0001          = 47  VTYPE   EQU     1          ;0:INDEPENDENT SEARCHES
              = 48                             ;1: SEARCH 2 = F(SEARCH 1)
              = 49
0001          = 50  HINCR   EQU     1
0001          = 51  VINCR   EQU     1
              = 52
              = 53
0044          = 54  HMIL10  EQU     68         ;HORIZ CONVERSION FACTOR
002B          = 55  VMIL10  EQU     43         ;VERT CONVERSION FACTOR
              = 56
0100          = 57  DCHORZ  EQU     256        ;HORIZ CENTER
0079          = 58  DCVERT  EQU     121        ;VERT CENTER
              = 59
              = 60
              = 61  $EJECT
              = 62  ;DEFINITIONS OF INDEXES INTO ZONE OUTPUT DATA LISTS
              = 63  ;   OFFSETS ARE FROM 'VOUT' -
              = 64  ;         DATA MOVED FROM 'VRTCL'/'HZNTL'
              = 65  ;
              = 66  ;'DLYCON' THRU 'SHORT' IS ZONE OUTPUT
              = 67  ; IN ORDERED PAIRS (V,H) OR (H,V)
              = 68  ;VERTICAL ZONES ARE (V,H)
              = 69  ;HORIZONTAL ZONES ARE (H,V)
              = 70  ;
0000          = 71  VOUT    SET     0
0002          = 72  DLYCON  SET     VOUT+2     ;CONSTANT DELAY
0004          = 73  DELAY   SET     DLYCON+2   ;VARIABLE DELAY (INCREMENTED)
0006          = 74  LONG    SET     DELAY+2    ;LONG SIDE OF SEARCH ZONE
0008          = 75  SHORT   SET     LONG+2     ;SHORT SIDE
              = 76
              = 77
000C          = 78  NDATA   SET     SHORT+4    ;BASIC DATA REQ FOR ANY DISPLAY
              = 79
              = 80  ;CONTROL PARAMENTERS NOT USED BY 'ZONE' OUTPUT
000A          = 81  BOXMX   SET     SHORT+2    ;MAX DELAY TO BOX FAR EDGE
000C          = 82  ZONMN   SET     BOXMX+2    ;MIN AVG
000E          = 83  ZONMX   SET     ZONMN+2    ;MAX AVG
0010          = 84  DINCS   SET     ZONMX+2    ;SMALL INCR
0012          = 85  DINCL   SET     DINCS+2    ; LARGE INCR ( +/-)
0014          = 86  NUDLY   SET     DINCL+2    ;NEXT DELAY
0016          = 87  OLDLY   SET     NUDLY+2    ; LAST DELAY USED
0018          = 88  AVGCT   SET     OLDLY+2    ;ACTUAL AVG CT
001A          = 89  QUAD    SET     AVGCT+2    ;QUAD 0=POS INC, NON-0=NEG INC
              = 90
001B          = 91  NVLST   SET     QUAD+1     ; # WORDS IN BUFFER
              = 92
```

```
LOC  OBJ        SEQ         SOURCE STATEMENT

000E        =  93 NPAD    SET     14
000B        =  94 NMISC   SET     11
000C        =  95 NEXPAD  SET     12
            =  96
0036        =  97 NVLEN0  SET     NVLST+NVLST
0025        =  98 NVLEN1  SET     NPAD+NMISC+NEXPAD
            =  99
005B        = 100 NVLEN   SET     NVLEN0+NVLEN1
            = 101
            = 102
            = 103 ;END    BNVDEF
            = 104
            = 105 $EJECT
              106 $TITLE ('BNVID.059    14 FEB 78')
              107 ASEG
              108
              109
              110 ;VIDEO ERRORS
0001          111 VT1ER   EQU     0001H   ;TARGET #1 SEARCH FAILED
0002          112 VT2ER   EQU     0002H   ;TARGET #2 SEARCH FAILED
0004          113 VXFRER  EQU     4H      ;VIDEO XFR ERROR
              114
              115
              116 ;VIDEO I/O PORTS
              117 ;1ST VIDEO I/O
0008          118 OV1CL   EQU     08H     ;CLR,SET B/W,SET INTENSITY
0010          119 OV1HD   EQU     10H     ;HORIZ DELAY
0018          120 OV1HZ   EQU     18H     ;HORIZ ZONE (WIDTH)
0020          121 OV1VD   EQU     20H     ;VERT DELAY
0028          122 OV1VZ   EQU     28H     ;VERT ZONE (HEIGTH)
0030          123 OV1EX   EQU     30H     ;EXECUTE VIDEO RASTER
0010          124 IV1ZC   EQU     OV1HD   ;READ TOTAL ZONE COUNTS
              125
              126 ;2ND VIDEO I/O
0050          127 OV2CL   EQU     50H     ;CLEAR
0058          128 OV2HD   EQU     58H     ;HORIZ DELAY
0060          129 OV2HZ   EQU     60H     ;HORIZ ZONE
0068          130 OV2VD   EQU     68H     ;VERT DELAY
0070          131 OV2VZ   EQU     70H     ;VERT ZONE
0078          132 OV2EX   EQU     78H     ;EXECUTE
0058          133 IV2ZC   EQU     OV2HD   ;READ
              134
              135
0080          136 INTNS   SET     80H     ;INTENSITY & BLK/WHT USED
              137
              138
0002          139 MINAVG  SET     2       ;MIN AVG ZONE CT FOR SLOW INCR
              140
              141
              142 $EJECT
              143 CSEG
              144
0000      C   145 BNVID   EQU     $
              146
```

```
LOC  OBJ         SEQ        SOURCE STATEMENT

147 ;BNVID   VIDEO HANDLERS, VIDEO SEARCH, VIDEO CONVERSION
                 148 ;
                 149
                 150 ;VXFR    FATAL VIDEO I/O ERROR
                 151 VXFR:
0000 210480      152          LXI     H,VXFRER+8000H  ;FATAL
                 153          ;JMP    VERROR
                 154
                 155 ;VERROR          VIDEO ERROR
                 156 ;        ENTER:  (HL) = RELATIVE ERROR BITS
                 157 ;        EXIT:   (CY) = 1 IFF FATAL ERROR BIT SET
                 158 VERROR:
0003 010000  E   159          LXI     B,VIDEV
0006 CD0000  E   160          CALL    EVDCOD
0009 3A0000  E   161          LDA     SYSTEM  ;AUTO/JOG ?
000C E600    E   162          ANI     SYAUT LOW
000E C21500  C   163          JNZ     VASST
0011 CD0000  E   164          CALL    SETEVT
0014 C9         165          RET
                 166 VASST:
0015 CD0000  E   167          CALL    ASSIST
0018 37          168          STC
0019 C9          169          RET
                 170
                 171
                 172 ;VZONES   IF FLAG SET, REPEAT ZONE FOR VISIBILITY
                 173 ;
                 174 ;        FOR VISIBILITY
                 175 VZONES:
001A 3A8400  D   176          LDA     VSPFL   ;GET REPEAT CT
                 177 VTIMER:
001D 3D          178          DCR     A
001E F5          179          PUSH    PSW
001F CD3E00  C   180          CALL    MIXZON
0022 F1          181          POP     PSW
0023 F8          182          RM
0024 C8          183          RZ
0025 C31D00  C   184          JMP     VTIMER
                 185 $EJECT
                 186
                 187 ;VCAMON TURN ON VIDEO CAMERA
                 188 VCAMON:
0028 DB00    E   189          IN      OCAMRA LOW
002A F600    E   190          ORI     VIDCAM LOW
002C D300    E   191          OUT     OCAMRA LOW
002E 2A0000  E   192          LHLD    VCMDLY  ;CAMERA DELAY
0031 CD0000  E   193          CALL    CKTINC
0034 C9          194          RET
                 195
                 196
                 197 ;VCAMOF TURN VIDEO CAMERA OFF
                 198 VCAMOF:
0035 DB00    E   199          IN      OCAMRA LOW
0037 F600    E   200          ORI     VIDCAM LOW
0039 EE00    E   201          XRI     VIDCAM LOW
```

```
LOC  OBJ         SEQ      SOURCE STATEMENT

003B D300     E  202          OUT    OCANRA LOW
003D C9          203          RET
                 204
                 205 $EJECT
                 206 ;MIXZON ISSUE SIMULTANEOUS ZONES TO BOTH VIDEOS
                 207 ;
                 208 MIXZON:
003E CD0000   E  209          CALL   MODEOU
0041 2A0000   D  210          LHLD   VEDGE+VOUT       ;ADDR (I/O LIST)
0044 44          211          MOV    B,H
0045 4D          212          MOV    C,L
0046 110100      213          LXI    D,1
0049 DB00     E  214          IN     IOACK LOW
004B E600     E  215          ANI    VSBIT LOW
004D FE00     E  216          CPI    VSBIT LOW        ;BOTH VIDEOS READY ?
004F C20000   C  217          JNZ    VXFR             ;NO - STOP
0052 EB          218          XCHG
0053 2A0000   E  219          LHLD   VINTNS           ;INTENSITY
0056 220000   E  220          SHLD   IODATA
0059 D308        221          OUT    OV1CL            ;INITIALIZE
005B 2A0200   E  222          LHLD   VINTNS+2
005E 220000   E  223          SHLD   IODATA
0061 D350        224          OUT    OV2CL
0063 210200   D  225          LXI    H,VEDGE+DLYCON   ;1ST DATA WORD
0066 CD9E00   C  226          CALL   VWRITE           ;CONSTANT DELAY
0069 CD9E00   C  227          CALL   VWRITE           ;VARIABLE DELAY
006C CD9E00   C  228          CALL   VWRITE           ;ZONE LTH
006F CD9E00   C  229          CALL   VWRITE           ;ZONE WIDTH
0072 D338        230          OUT    OV1EX            ;EXECUTE
0074 D378        231          OUT    OV2EX
                 232 RDZON:
0076 CD0000   E  233          CALL   MODEIN
0079 DB00     E  234 RDZON0:  IN     IOACK LOW
007B E600     E  235          ANI    VSBIT LOW        ;WAIT FOR BOTH
007D FE00     E  236          CPI    VSBIT LOW
007F C27900   C  237          JNZ    RDZON0           ;NOT YET
0082 DB58        238          IN     IV2ZC            ;ZONE 2
0084 2A0000   E  239          LHLD   IODATA
0087 228800   D  240          SHLD   ZONCT2
008A EB          241          XCHG
008B DB10        242          IN     IV1ZC            ;ZONE 1
008D 2A0000   E  243          LHLD   IODATA
0090 228600   D  244          SHLD   ZONCT1
0093 CD0000   E  245          CALL   HCMPD            ;PICK MAX
0096 D29A00   C  246          JNC    MXZONX
0099 EB          247          XCHG
                 248 MXZONX:
009A 228A00   D  249          SHLD   DTVZC
009D C9          250          RET
                 251
                 252 $EJECT
                 253 ;VWRITE   WRITE FROM DATA LIST TO 2 VARIABLE PORTS
                 254 ;    ENTER: (BC) = ADDR(I/O LIST)
                 255 ;           (HL) = ADDR(DATA LIST)
                 256 VWRITE:
```

| LOC | OBJ | | SEQ | SOURCE STATEMENT | | |
|---|---|---|---|---|---|---|
| 009E | 5E | | 257 | MOV | E,M | |
| 009F | 23 | | 258 | INX | H | |
| 00A0 | 56 | | 259 | MOV | D,M | |
| 00A1 | 23 | | 260 | INX | H | |
| 00A2 | EB | | 261 | XCHG | | |
| 00A3 | 220000 | E | 262 | SHLD | IODATA | |
| 00A6 | EB | | 263 | XCHG | | |
| | | | 264 | VWR1: | | |
| 00A7 | 0A | | 265 | LDAX | B | ;GET 1ST PORT |
| 00A8 | 03 | | 266 | INX | B | |
| 00A9 | 320100 | E | 267 | STA | WRITE+1 | |
| 00AC | CD0000 | E | 268 | CALL WRITE | | |
| 00AF | C648 | | 269 | ADI | OV2CL-OV1CL | ;CALC 2ND PORT |
| 00B1 | 320100 | E | 270 | STA | WRITE+1 | |
| 00B4 | CD0000 | E | 271 | CALL WRITE | | |
| 00B7 | C9 | | 272 | RET | | |
| | | | 273 | | | |
| | | | 274 | | | |
| | | | 275 | | | |
| | | | 276 | INIVIO: | | |
| 00B8 | CD0000 | E | 277 | CALL MODEOU | | |
| 00BB | 220000 | E | 278 | SHLD | IODATA | |
| 00BE | D309 | | 279 | OUT | OV1CL LOW | |
| 00C0 | D350 | | 280 | OUT | OV2CL LOW | |
| 00C2 | C9 | | 281 | RET | | |
| | | | 282 | | | |
| | | | 283 | | | |
| | | | 284 | $EJECT | | |
| | | | 285 | ;VIDEO INITIALIZE FOR VIDEO SEARCH | | |
| | | | 286 | ;      ENTER:   (A) = TARGET # ( 1 OR 2 ) | | |
| | | | 287 | ;               (C) = SPEED CONTROL (# ZONE REPEATS) | | |
| | | | 288 | ; | | |
| | | | 289 | VIDEO: | | |
| 00C3 | 328500 | D | 290 | STA | TARGET | ;SAVE TARGET # |
| 00C6 | 79 | | 291 | MOV | A,C | |
| 00C7 | 328400 | D | 292 | STA | VSPFL | ;SET # ZONE REPETITIONS |
| 00CA | 210601 | C | 293 | LXI | H,VFIND | ;ENABLE DISPATCH TO SEARCH |
| 00CD | CDDD00 | C | 294 | CALL DSPVID | | |
| 00D0 | CD2800 | C | 295 | CALL VCAMON | | ;TURN ON VIDEO CAMERA |
| 00D3 | CDA603 | C | 296 | CALL VSETUP | | |
| 00D6 | CD0704 | C | 297 | CALL SETE1 | | ;SET UP FOR LEAD EDGE |
| 00D9 | C9 | | 298 | RET | | |
| | | | 299 | | | |
| | | | 300 | | | |
| | | | 301 | ;DSPZON DISPLAY ZONE | | |
| | | | 302 | DSPZON: | | |
| 00DA | 211A00 | C | 303 | LXI | H,VZONES | ;ENABLE GENERAL ZONE DISPLAY |
| | | | 304 | | | |
| | | | 305 | ;DSPVID  DISPATCH TO VIDEO | | |
| | | | 306 | ;      ENTER: (HL) = ADDR OF SERVICE ROUTINE | | |
| | | | 307 | ; | | |
| | | | 308 | DSPVID: | | |
| 00DD | 220000 | E | 309 | SHLD | VSRV | |
| 00E0 | 3E01 | | 310 | MVI | A,1 | |
| 00E2 | 320000 | E | 311 | STA | VCTL | |

```
LOC  OBJ          SEQ         SOURCE STATEMENT

00E5 3A0000   E   312         LDA     SYSTEM
00E8 F600     E   313         ORI     SYVID LOW
00EA 320000   E   314         STA     SYSTEM
00ED C9           315         RET
                  316
                  317
                  318 ;SEARCH      FIND THE TARGET
                  319 ;    EXIT:   (CY) = 1 IFF SEARCH FAILED
                  320 SEARCH:
00EE CD0601   C   321         CALL    VFIND      ;DISPATCH TO VIDEO ROUTINE
00F1 3A0000   E   322         LDA     VCTL       ;DONE ?
00F4 E601         323         ANI     1
00F6 C2EE00   C   324         JNZ SEARCH         ;NO
00F9 C8          325          RZ                 ;YES, SEARCH SUCCESSFUL
00FA 37          326          STC                ;YES, SEARCH FAILED
00FB C9          327          RET
                 328
                 329
                 330 ;SHOBOX   DISPLAY SEARCH BOX FOR CURRENT TARGET
                 331 SHOBOX:
00FC CDB605   C  332          CALL    GETBOX     ;GET BOX, BASED ON TARGET
00FF CDDA00   C  333          CALL    DSPZON     ;DISPLAY ZONE
0102 CD2800   C  334          CALL    VCAMON     ;TURN ON CAMERA
0105 C9          335          RET
                 336
                 337 $EJECT
                 338 ;VFIND   VIDEO SEARCH DRIVER
                 339 VFIND:
0106 3A8300   D  340          LDA     NEDGE      ;GET EDGE NOW RUNNING
0109 B7          341          ORA     A
010A 17          342          RAL                ;USE AS INDEX
010B 5F          343          MOV     E,A
010C 1600        344          MVI     D,0
                 345
010E 3A8500   D  347          LDA     TARGET     ;TARGET 1 ?
0111 FE01        348          CPI     1
0113 CA1C01   C  349          JZ VFIND1          ;YES
0116 213101   C  350          LXI     H,V2ADDR-2 ;NO
0119 C31F01   C  351          JMP VFIND3
                 353
                 354 VFIND1:
011C 212301   C  355          LXI     H,V1ADDR-2     ;BUILD JMP ADDR
011F 19          356 VFIND3: DAD    D
0120 5E          357          MOV     E,M        ;GET ROUTINE ADDR
0121 23          358          INX     H
0122 56          359          MOV     D,M
0123 EB          360          XCHG
0124 E9          361          PCHL               ;GO THERE
                 362
                 363 ;LIST OF VFIND ROUTINES
                 364 V1ADDR:
0125 4101     C  365          DW      DOE1       ;EDGE 1
0127 4A01     C  366          DW      DOE2       ;EDGE 2
0129 D601     C  367          DW      PAD1
```

```
LOC  OBJ        SEQ        SOURCE STATEMENT

012B DD01    C  368            DW      PAD2
012D DD01    C  369            DW      PAD2
012F 4F02    C  370            DW      PADXT1
0131 4F02    C  371            DW      PADXT1    ;RESERVED FOR PATCH
                372
                373
                375 V2ADDR:
0133 5901    C  376            DW      DOE1T2    ;FIND EDGE 1
0135 D601    C  377            DW      PAD1      ;1ST PAD
0137 DD01    C  378            DW      PAD2
0139 DD01    C  379            DW      PAD2
013B DD01    C  380            DW      PAD2
013D 5A02    C  381            DW      PADXT2
013F 5A02    C  382            DW      PADXT2    ;RESERVED FOR PATCH
                383
                385
                386 $EJECT
                387 ;DOE1   LOOK FOR EDGE 1
                388 DOE1:
0141 CD5F01  C  389            CALL    EDGE1
0144 A7         390            ANA     A
0145 C0         391            RNZ               ;STILL LOOKING OR FAILED
                392 E1TO2:
0146 CD1904  C  393            CALL    SETE2     ;GOT EDGE - SET UP EDGE 2
0149 C9         394            RET
                395
                396 ;DOE2   LOOK FOR EDGE 2
                397 DOE2:
014A CD9C01  C  398            CALL    EDGE2     ;EDGE 2 SEARCH
014D A7         399            ANA     A
                400
014E FA5501  C  401            JM      E2TO1     ;FAILED
0151 CC6804  C  402            CZ      SETPD     ;GOT EDGE 2 - DO PAD TEST
0154 C9         403            RET
                404 E2TO1:
0155 CD0704  C  405            CALL    SETE1
0158 C9         406            RET
                407
                408
                410
                411 ;DOE1T2     FIND EDGE 1 OF TARGET 2
                412 ;       BASED ON TARGET 1 RESULTS
                413 DOE1T2:
0159 CD0C05  C  414            CALL    GTT2E1    ;SET UP FOR EDGE 1,TARGET 2
015C C34101  C  415            JMP     DOE1      ;AND DO NORMAL EDGE 1 SEARCH
                416
                418
                419
                420 $EJECT
                421 ;EDGE1 SEARCH
                422 ;   LET    AVGCT = TOTAL ZONE CT/SHORT SIDE LENGTH
                423 ;   LOOK FOR AVGCT WITHIN SPECIFIED LIMITS
                424 ;   ELSE CONT TILL ZONE FAR EDGE PAST BOX FAR EDGE
                425 ;      ENTER: EDGE 1 PARAM MOVED INTO 'VEDGE' BUFFER
                426 ;      EXIT:  (A) = -1 (OUT OF BOX)
```

| LOC OBJ | SEQ | SOURCE STATEMENT | | |
|---|---|---|---|---|
| | 427 ; | | | 0 (GOT EDGE) |
| | 428 ; | | | 3 (STILL LOOKING) |
| | 429 EDGE1: | | | |
| 015F CDFC02 C | 430 | CALL | EDGE | ;LOOK FOR EDGE |
| 0162 CE00 | 431 | ACI | 0 | ;GET (CY)+(A) |
| 0164 FE02 | 432 | CPI | 2 | ;OUT OF BOX ? |
| 0166 CA7901 C | 433 | JZ | NOE1 | ;YES |
| 0169 FE03 | 434 | CPI | 3 | ;NO, STILL LOOKING ? |
| 016B CA5F01 C | 435 | JZ | EDGE1 | ;KEEP LOOKING |
| 016E CD5104 C | 436 | CALL | SVEDG | ;NO,GOT EDGE-SAVE DELAY,AVGCT |
| 0171 2A0400 D | 437 | LHLD | VEDGE+DELAY | ;SAVE DELAY FOR 2ND EDGE |
| 0174 226100 D | 438 | SHLD | CONDLY | |
| 0177 97 | 439 | SUB | A | ; SET (A) = 0 |
| 0178 C9 | 440 | RET | | |
| | 441 NOE1: | | | |
| 0179 010000 E | 442 | LXI | B,VIDEV | |
| 017C 210100 | 443 | LXI | H,VT1ER | |
| 017F 3A8500 D | 444 | LDA | TARGET | ;TARGET # 1 OR 2 ? |
| 0182 FE02 | 445 | CPI | 2 | |
| 0184 C28801 C | 446 | JNZ | VEVNT | ;1 |
| 0187 23 | 447 | INX | H | |
| | 448 VEVNT: | | | |
| 0188 CD3500 C | 449 | CALL | VCAMOF | ;TURN VIDEO CAMERA OFF |
| 018B 3A0000 E | 450 | LDA | SYSTEM | ;NOTE VIDEO OFF |
| 018E EE00 E | 451 | XRI | SYVID LOW | |
| 0190 320000 E | 452 | STA | SYSTEM | |
| 0193 3E80 | 453 | MVI | A,80H | ;SET (A) AS FLAG |
| 0195 320000 E | 454 | STA | VCTL | ;SET CONTROL FLAG ALSO |
| 0198 CD0300 C | 455 | CALL | VERROR | ;NOTE SEARCH ERROR |
| 019B C9 | 456 | RET | | |
| | 457 | | | |
| | 458 | | | |
| | 459 $EJECT | | | |
| | 460 ;EDGE2 SEARCH | | | |
| | 461 EDGE2: | | | |
| 019C CDFC02 C | 462 | CALL | EDGE | ;LOOK FOR EDGE |
| 019F CE00 | 463 | ACI | 0 | ;GET (CY) + (A) |
| 01A1 FE02 | 464 | CPI | 2 | |
| 01A3 CAD301 C | 465 | JZ NOE2 | | ;OUT OF BOX |
| 01A6 FE03 | 466 | CPI | 3 | |
| 01A8 C2BC01 C | 467 | JNZ | E2POSS | ;MAYBE GOT EDGE |
| 01AB 3A8100 D | 468 | LDA | E2FLAG | ;DID WE TRY AT LEAST ONE ROW ? |
| 01AE A7 | 469 | ANA | A | |
| 01AF CA9C01 C | 470 | JZ EDGE2 | | ;NO |
| 01B2 3A8000 D | 471 | LDA | VFLAG | ;YES, DID WE PASS AT LEAST ONCE? |
| 01B5 A7 | 472 | ANA | A | |
| 01B6 CA9C01 C | 473 | JZ EDGE2 | | ;NO |
| 01B9 C33F02 C | 474 | JMP TESTOK | | ;YES |
| | 475 E2POSS: | | | |
| 01BC CD5104 C | 476 | CALL | SVEDG | ;GOT EDGE - SAVE DELAY,AVGCT |
| 01BF 3A8200 D | 477 | LDA | VPASS | ;SAVE REDELAY ? |
| 01C2 FE02 | 478 | CPI | 2 | |
| 01C4 C2D101 C | 479 | JNZ YESE2 | | ;NO |
| 01C7 2A0400 D | 480 | LHLD | VEDGE+DELAY | ;YES |
| 01CA 225F00 D | 481 | SHLD | REDLY | |

```
LOC  OBJ        SEQ         SOURCE STATEMENT

01CD 3C          482         INR     A        ;SET FLAG TO 3
01CE 328200  D   483         STA     VPASS
                 484 YESE2:
01D1 97          485         SUB     A        ; SET (A) = 0 (SUCCESS)
01D2 C9          486         RET
                 487 NOE2:
01D3 3E80        488         MVI     A,80H    ;OUT OF BOX
01D5 C9          489         RET
                 490
                 491 $EJECT
                 492 ;PAD TESTS
                 493 ;  VARIOUS TEST PADS ARE ISSUED AND THE MAX ZONE COUNT
                 494 ;  WITH ITS DELAY SAVED. IF MAX CT> MIN LEGAL CT,
                 495 ;  THE TEST IS ASSUMED SUCCESSFUL.
                 496 PAD1:
01D6 CD1A00  C   497         CALL    VZONES   ;ISSUED PAD
01D9 CDC304  C   498         CALL    PDTST    ;SAVE MAX PAD CT,DELAYS
01DC C9          499         RET
                 500
                 501
                 502
                 503 ;PAD2 MOVE TEST PAD AWAY FROM LEAD EDGE
                 504 PAD2:
01DD 3A6900  D   505         LDA     LDEDG    ;WHICH IS LEADING EDGE
01E0 FE01        506         CPI     1
01E2 C2EB01  C   507         JNZ     PAD2H    ;HORIZONTAL
01E5 2A2800  D   508         LHLD    VRTCL+DINCS
01E8 C3EE01  C   509         JMP     PAD2X
                 510 PAD2H:
01EB 2A4600  D   511         LHLD    HZNTL+DINCS
                 512 PAD2X:
01EE EB          513         XCHG
01EF 2A0200  D   514         LHLD    VEDGE+DLYCON   ;NEW DELAY
01F2 19          515         DAD     D
01F3 00          516         NOP
01F4 220200  D   517         SHLD    VEDGE+DLYCON
01F7 CD1A00  C   518         CALL    VZONES
01FA CDC304  C   519         CALL    PDTST
01FD C9          520         RET
                 521
                 522
                 523 ;PAD3IN    RESTORE EDGE 1 DELAY
                 524 PAD3IN:
01FE 2A5100  D   525         LHLD    PADLY
0201 220200  D   526         SHLD    VEDGE+DLYCON
                 527
                 528 ;PAD3 MOVE PAD FROM 2ND EDGE, GET RESULTS
                 529 PAD3:
0204 2A0400  D   530         LHLD    VEDGE+DELAY   ;CHANGE OTHER DELAY
0207 EB          531         XCHG
0208 2A1000  D   532         LHLD    VEDGE+DINCS
020B 3A1A00  D   533         LDA     VEDGE+QUAD
020E A7          534         ANA     A
020F F5          535         PUSH    PSW
```

```
LOC  OBJ          SEQ       SOURCE STATEMENT

0210 C40000    E  536           CNZ   DNEG
0213 CD0000    E  537           CALL  DHALF
0216 F1           538           POP   PSW
0217 C40000    E  539           CNZ   DNEG
021A 19           540           DAD   D
021B 220400    D  541           SHLD  VEDGE+DELAY
021E CD1A00    C  542           CALL  VZONES
0221 CDC304    C  543           CALL  PDTST
0224 C9          544           RET
                  545 $EJECT
                  546 ; TEST  PAD TESTS COMPLETE - TEST MAX PAD CT
                  547 ;    AGAINST EXPECTED CT
                  548 ;    IF MAX > OR = EXP, TEST SUCCESSFUL
                  549 ;    ELSE  RETURN TO EDGE2 SEARCH
                  550 ;    EXIT:  CY = 0 IFF TESTS COMPLETE
                  551 ;    ELSE   CY = 1, A = 0 IF STILL LOOKING
                  552 ;           CY = 1, A = -1 IF TESTS OK BUT EDGE
                  553 ;              CHECK FAILED
                  554 TEST:
0225 2A5900    D  555           LHLD  PADMN     ;MAX ZONE CT OF THE FOUR PADS
0228 EB           556           XCHG            ;MAX > MIN-ACCEPTABLE ?
0229 2A7600    D  557           LHLD  PADMX
022C CD0000    E  558           CALL  HCMPD
022F 3E01         559           MVI   A,1
0231 D8           560           RC              ;NO
0232 3A8000    D  561           LDA   VFLAG     ;YES, TESTS COMPLETE ?
0235 A7           562           ANA   A
0236 37           563           STC
0237 C23F02    C  564           JNZ   TESTOK    ;YES
023A 3C           565           INR   A         ;NO, GET 1 MORE SUCCESS
023B 328000    D  566           STA   VFLAG
023E C9           567           RET
                  568 TESTOK:
023F CDB402    C  569           CALL  PADFIN    ;SET UP TO SHOW FINAL PAD
0242 CDC202    C  570           CALL  CKTARG    ;BE SURE WE'RE ON AN EDGE HERE
0245 3EFF         571           MVI   A,-1
0247 D8           572           RC              ;NOPE
0248 CDCF03    C  573           CALL  VCNVRT    ;YES, GET FINAL RESULTS
024B CD9F02    C  574           CALL  VFOUN     ;TURN OFF VIDEO
024E C9           575           RET
                  576
                  577 ;PADXT1    TEST FOR SEARCH COMPLETE
                  578 PADXT1:
024F CD2502    C  579           CALL  TEST      ;TEST FOR SUCCESS
0252 D0           580           RNC             ;TESTS COMPLETE - GOT PAD
0253 A7           581           ANA   A
0254 F24601    C  582           JP    E1TO2     ;NOT DONE - RETURN TO EDGE 2
0257 C37901    C  583           JMP   NOE1      ;TOO FAR DOWN
                  584
                  585 $EJECT
                  587
                  588 ;PADXT2    READY TO TEST RESULTS SO FAR
                  589 ;         IF LARGEST ZONE CT > MIN, AND
                  590 ;           IF # SUCCESSES SATISFIED, QUIT
                  591 ;         ELSE MOVE PAD ZONE FROM EDGE 2 & CONT
```

```
LOC  OBJ         SEQ       SOURCE STATEMENT

592 PADXT2:
025A CD1904   C  593       CALL  SETE2      ;BRING IN EDGE 2 PARAMETERS
025D CD2502   C  594       CALL  TEST       ;LARGEST ZONE CT > MIN ?
0260 D0          595       RNC              ;YES, AND # SUCCESSES SATISFIED
0261 2A6100   D  596       LHLD  CONDLY     ;NO, RESET EDGE 1 DELAY
0264 225100   D  597       SHLD  PADLY
0267 2A1000   D  598       LHLD  VEDGE+DINCS      ;MOVE ZONE
026A EB          599       XCHG
026B 2A5300   D  600       LHLD  PADLY+2 ; FROM EDGE 2
026E 19          601       DAD   D
026F 225300   D  602       SHLD  PADLY+2
0272 EB          603       XCHG
0273 CDE804   C  604       CALL  TSTBX2     ;REACHED EDGE 2 SEARCH LIMIT ?
0276 DA7D02   C  605       JC    T2PD3X     ;YES, SEE IF ANY SUCCESS
0279 CD7604   C  606       CALL  SETPD2     ;NO, BRING IN PAD PARAMETERS
027C C9          607       RET              ;NOTE: NEDGE = 2 FROM 'SETE2'
                 608 T2PD3X:
027D 3A8000   D  609       LDA   VFLAG      ;ANY SUCCESS ?
0280 A7          610       ANA   A
0281 CA7901   C  611       JZ    NOE1       ;DEFINITELY NOT
0284 CD2502   C  612       CALL  TEST       ;MAYBE - TEST
0287 DA7901   C  613       JC    NOE1       ;NOPE
028A C9          614       RET              ;YES, CALCULATIONS COMPLETE
                 615
                 616
                 618 ;CKEDGE SEE IF WE'RE STILL ON THE EDGE
                 619 ;
                 620 CKEDGE:
028B CD1A00   C  621       CALL  VZONES           ;OUTPUT ZONES
028E E5          622       PUSH  H                ;SAVE AREA CT
028F 2A5900   D  623       LHLD  PADMN            ; TO COMPARE WITH EXP
0292 0E02         624      MVI   C,2              ;GET 20%
0294 CD0000   E  625       CALL  GETPCT
0297 E1          626       POP   H
0298 CD0000   E  627       CALL  HCMPD            ;AREA CT S/B SMALL
029B CDB402   C  628       CALL  PADFIN           ;PUT PAD PARAMETERS BACK
029E C9          629       RET
                 630
                 631
                 632
                 633 ;VFOUN  TURN OFF VIDEO SEARCH
                 634 VFOUN:
029F 97          635       SUB   A          ;SEARCH COMPL: DISABLE DISPATCH
02A0 320000   E  636       STA   VCTL
02A3 211A00   C  637       LXI   H,VZONES   ;LET NEXT DISPATCH
02A6 220000   E  638       SHLD  VSRV       ; DISPLAY RESULTS
02A9 3A0000   E  639       LDA   SYSTEM
02AC FE00    E  640        ORI   SYVID LOW
02AE EE00    E  641        XRI   SYVID LOW
02B0 320000   E  642       STA   SYSTEM
02B3 C9          643       RET
                 644
                 645
                 646
```

| LOC OBJ | SEQ | SOURCE STATEMENT | | |
|---|---|---|---|---|
| | 647 | | | |
| | 648 | ;PADFIN | FIX EDGE DELAYS IN ORDER (X,Y) OR (H,V) | |
| | 649 | ; | USING DELAYS FOR MOST SUCCESSFUL PAD | |
| | 650 | PADFIN: | | |
| 02B4 2A7800 D | 651 | | LHLD | PADMX+2 ; GET DELAYS OF SUCCESS PAD |
| 02B7 220200 D | 652 | | SHLD | VEDGE+DLYCON |
| 02BA EB | 653 | | XCHG | |
| 02BB 2A7A00 D | 654 | | LHLD | PADMX+4 |
| 02BE 220400 D | 655 | | SHLD | VEDGE+DELAY |
| 02C1 C9 | 656 | | RET | |
| | 657 | | | |
| | 658 | | | |
| | 659 | ;CKTARG | IF TARGET 1, TEST FOR EDGES | |
| | 660 | CKTARG: | | |
| 02C2 3A5500 D | 661 | | LDA | TARGET |
| 02C5 FE01 | 662 | | CPI | 1 |
| 02C7 C0 | 663 | | RNZ | ;TARGET 2 |
| 02C8 2A5D00 D | 664 | | LHLD | PADOFF+2  ;CK EDGE 2 |
| 02CB EB | 665 | | XCHG | |
| 02CC 2A5700 D | 666 | | LHLD | PADZN+2 |
| 02CF CDF202 C | 667 | | CALL | EDGSET |
| 02D2 2A7A00 D | 668 | | LHLD | PADMX+4 |
| 02D5 19 | 669 | | DAD | D |
| 02D6 220400 D | 670 | | SHLD | VEDGE+DELAY |
| 02D9 CD8B02 C | 671 | | CALL | CKEDGE |
| 02DC D8 | 672 | | RC | ;NOT ON EDGE 2 |
| 02DD 2A5B00 D | 673 | | LHLD | PADOFF ;CK EDGE 1 |
| 02E0 EB | 674 | | XCHG | |
| 02E1 2A5500 D | 675 | | LHLD | PADZN |
| 02E4 CDF202 C | 676 | | CALL | EDGSET |
| 02E7 2A7800 D | 677 | | LHLD | PADMX+2 |
| 02EA 19 | 678 | | DAD | D |
| 02EB 220200 D | 679 | | SHLD | VEDGE+DLYCON |
| 02EE CD8B02 C | 680 | | CALL | CKEDGE |
| 02F1 C9 | 681 | | RET | |
| | 682 | | | |
| | 683 | | | |
| | 684 | EDGSET: | | |
| 02F2 3A1A00 D | 685 | | LDA | VEDGE+QUAD ;CK DIRECTION |
| 02F5 A7 | 686 | | ANA | A |
| 02F6 19 | 687 | | DAD | D |
| 02F7 CC0900 E | 688 | | CZ | DNEG ;REVERSE DIRECTION |
| 02FA EB | 689 | | XCHG | |
| 02FB C9 | 690 | | RET | |
| | 691 | | | |
| | 692 | $EJECT | | |
| | 693 | ;EDGE | LOOK FOR TARGET EDGE | |
| | 694 | ; | OUTPUT ZONE WITHIN SPECIFIED AREA MOVING FROM | |
| | 695 | ; | OUTSIDE TOWARDS THE EXPECTED EDGE | |
| | 696 | ; | TEST FOR AVGCT=TOTAL CT/SHORT SIDE WITHIN RANGE | |
| | 697 | ; | SET UP FOR NEXT (INCREMENTED) DELAY | |
| | 698 | ; | IF AVGCT=0, NEXT INCREMENT = SHORT SIDE | |
| | 699 | ; | ELSE NEXT INCR = SMALL INCREMENT | |
| | 700 | ; | IF AVGCT OUT OF RANGE, | |
| | 701 | ; | TEST FOR NEXT ZONE EDGE OUT OF BOX | |

```
LOC  OBJ         SEQ       SOURCE STATEMENT

702 ; EXIT:         (CY)+(A) = 1 (SUCCESS)
                 703 ;                        = 2 (OUT OF BOX)
                 704 ;                        = 3 (STILL LOOKING FOR EDGE)
02FC 2A1400   D  705 EDGE:  LHLD   VEDGE+NUDLY   ;USE (POST-INCR) DELAY
02FF 220400   D  706        SHLD   VEDGE+DELAY
0302 CD8103   C  707        CALL   TSTBX         ;OUT OF BOX ?
0305 D0          708        RNC                  ;YES
0306 CD1A00   C  709        CALL   VZONES        ;ISSUE ZONE
0309 2A0A00   D  710        LHLD   DTVZC         ;TOTAL CT / SHORT SIDE
030C EB          711        XCHG
030D 3A0800   D  712        LDA    VEDGE+SHORT
0310 47          713        MOV    B,A
0311 CD0000   E  714        CALL   SDVRN         ;DIVIDE & ROUND
0314 7B          715        MOV    A,E
0315 1600        716        MVI    D,0
0317 EB          717        XCHG
0318 221800   D  718        SHLD   VEDGE+AVGCT   ;SAVE AVG
031B CD4303   C  719        CALL   NXTZON        ;GET NEXT INCR
031E E5          720        PUSH   H
031F C40000   E  721        CNZ    DNEG          ;NEGATE
                 722 MYZON:
0322 EB          723        XCHG
0323 2A0400   D  724        LHLD   VEDGE+DELAY
0326 19          725        DAD    D
0327 221400   D  726        SHLD   VEDGE+NUDLY   ; = NEXT DELAY
032A E1          727        POP    H
032B 7D          728        MOV    A,L
032C B4          729        ORA    H
032D FE01        730        CPI    1
032F C23D03   C  731        JNZ    LIMX
0332 2A1800   D  732        LHLD   VEDGE+AVGCT
0335 EB          733        XCHG
0336 2A0E00   D  734        LHLD   VEDGE+ZONMX   ;YES, CK MAX
0339 CD0000   E  735        CALL   HCMPD         ; AVG < MAX ?
033C 3F          736        CMC
033D 3E00        737 LIMX:  MVI    A,0           ;SET A=0 IF EXIT
033F D8          738        RC                   ; AVG WITHIN LIMITS
0340 3E03        739        MVI    A,3           ; NOT WITHIN LIMITS, LOOK MORE
0342 C9          740        RET
                 741
                 742
                 743 $EJECT
                 744 ;NXTZON  DETERMINE THE INCREMENT FOR THE NEXT ZONE DELAY
                 745 ;   ENTER:   (A ) = AVG CT ON LONG SIDE
                 746 ;            (HL) = AVG CT
                 747 ;   EXIT:    (HL) = ABS INCR
                 748 ;            (Z ) = 1 IFF NEG TRAVEL FROM EDGE
                 749 ;
                 750 NXTZON:
0343 EB          751        XCHG
0344 FE02        752        CPI    MINAVG        ;AVG > 2 ?
0346 2A0800   D  753        LHLD   VEDGE+SHORT
0349 DA7C03   C  754        JC     NXTZNX        ;NO
034C CD0000   E  755        CALL   DHALF         ;YES, GET HALF ZONE
```

| LOC | OBJ | | SEQ | SOURCE STATEMENT | | | |
|---|---|---|---|---|---|---|---|
| 034F | E5 | | 756 | PUSH | H | ;SAVE | |
| 0350 | CD0000 | E | 757 | CALL | DHALF | ;GET QTR ZONE | |
| 0353 | E5 | | 758 | PUSH | H | ;SAVE | |
| 0354 | 2A0C00 | D | 759 | LHLD | VEDGE+ZONMN | ;GET MIN FOR 'EDGE' | |
| 0357 | EB | | 760 | XCHG | | | |
| 0358 | CD0000 | E | 761 | CALL | HCMPD | ;AVG > MIN ? | |
| 035B | DA6603 | C | 762 | JC NXTZN2 | | ;NO | |
| 035E | C1 | | 763 | POP | B | ;YES, CREEP | |
| 035F | C1 | | 764 | POP | B | ;GOING SMALLEST INCR | |
| 0360 | 210100 | | 765 | LXI | H,1 | | |
| 0363 | C37C03 | C | 766 | JMP NXTZNX | | | |
| | | | 767 NXTZN2: | | | | |
| 0366 | 29 | | 768 | DAD | H | ;2*AVG > MIN ? | |
| 0367 | CD0000 | E | 769 | CALL | HCMPD | | |
| 036A | DA7203 | C | 770 | JC NXTZN3 | | ;NO | |
| 036D | E1 | | 771 | POP | H | ;YES, USE QTR ZONE | |
| 036E | C1 | | 772 | POP | B | | |
| 036F | C37C03 | C | 773 | JMP NXTZNX | | | |
| | | | 774 NXTZN3: | | | | |
| 0372 | 29 | | 775 | DAD | H | ;4*AVG > MIN ? | |
| 0373 | CD0000 | E | 776 | CALL | HCMPD | | |
| 0376 | C1 | | 777 | POP | B | ;QTR | |
| 0377 | E1 | | 778 | POP | H | ;HALF | |
| 0378 | D27C03 | C | 779 | JNC NXTZNX | | ;YES , USE HALF | |
| 037B | 09 | | 780 | DAD | B | ;NO, USE 3-QTR | |
| | | | 781 NXTZNX: | | | | |
| 037C | 3A1A00 | D | 782 | LDA | VEDGE+QUAD | | |
| 037F | A7 | | 783 | ANA | A | | |
| 0380 | C9 | | 784 | RET | | | |
| | | | 785 | | | | |
| | | | 786 $EJECT | | | | |
| | | | 787 ;TSTBX TEST NEW DELAY AGAINST FAR EDGE OF BOX | | | | |
| | | | 788 ; | ENTER: (HL) = NEW (VARIABLE) DELAY | | | |
| | | | 789 ; | EXIT: IF STILL IN BOX, CY=1 | | | |
| | | | 790 ; | ELSE CY=0 WITH A=2 FOR EXIT FROM SEARCH | | | |
| | | | 791 TSTBX: | | | | |
| 0381 | EB | | 792 | XCHG | | ; OF NEXT ZONE | |
| 0382 | 3A1A00 | D | 793 | LDA | VEDGE+QUAD | ;NEG MOTION ? | |
| 0385 | A7 | | 794 | ANA | A | | |
| 0386 | C28E03 | C | 795 | JNZ BXEDG | | ;YES | |
| 0389 | 2A0800 | D | 796 | LHLD | VEDGE+SHORT | ;NO, SHORT SIDE+DELAY | |
| 038C | 19 | | 797 | DAD | D | | |
| 038D | EB | | 798 | XCHG | | | |
| | | | 799 BXEDG: | | | | |
| 038E | 2A0A00 | D | 800 | LHLD | VEDGE+BOXMX | ;PAST BOX ON NEXT ZONE ? | |
| 0391 | EB | | 801 | XCHG | | | |
| 0392 | CD0000 | E | 802 | CALL | DSUB | ;CY GETS SET/RESET BUT | |
| 0395 | 3A1A00 | D | 803 | LDA | VEDGE+QUAD | ;INTERPRETATION=F(DIR) | |
| 0398 | F5 | | 804 | PUSH | PSW | ;SAVE CY | |
| 0399 | A7 | | 805 | ANA | A | | |
| 039A | CAA203 | C | 806 | JZ POSINC | | ;POS INCR - CY OK AS IS | |
| 039D | F1 | | 807 | POP | PSW | | |
| 039E | 3F | | 808 | CMC | | ;NEG INCR - REVERSE CY | |
| 039F | C3A303 | C | 809 | JMP EDGXT | | | |

```
LOC   OBJ         SEQ       SOURCE STATEMENT

03A2  F1          810 POSINC: POP    PSW
03A3  3E02        811 EDGXT:  MVI    A,2
03A5  C9          812         RET
                  813 $EJECT
                  814 ;VSETUP  INITIALIZE FOR TARGET SEARCH
                  815 VSETUP:
03A6  3A8500   D  817         LDA    TARGET
03A9  3D          818         DCR    A
03AA  328000   D  819         STA    VFLAG
03AD  97          821         SUB    A         ;CLEAR INIT FLAG
03AE  328200   D  822         STA    VPASS
03B1  328100   D  823         STA    E2FLAG
03B4  210000      824         LXI    H,0
03B7  227600   D  825         SHLD   PADMX
03BA  3A8500   D  826         LDA    TARGET    ;GET TARGET #
03BD  FE01        827         CPI    1         ; TARGET #1 ?
03BF  C2C803   C  828         JNZ    VSTUP2    ;NO, THEN #2
03C2  110000   E  829         LXI    D,BOX1    ;SET ADDR OF SEARCH BOX
03C5  C3CB03   C  830         JMP    VSTUP0
03C8  110000   E  831 VSTUP2: LXI    D,BOX2
03CB  CDC405   C  832 VSTUP0: CALL   GETBX     ;MOVE IN PARAMETERS
03CE  C9          833         RET
                  834
                  835
                  836 ;VCNVRT    CONVERT RESULTS OF SEARCH
                  837 ;   TO A COORDINATE PAIR IN DELAY UNITS
                  838 ;   (SDX,SDY) RELATIVE TO (VX,VY) THIS TARGET
                  839 ;
                  840 VCNVRT:
03CF  2A0600   D  841         LHLD   VEDGE+LONG ;1/2 DELAY FOR PAD WIDTH
03D2  CD0000   E  842         CALL   DHALF
03D5  EB          843         XCHG
03D6  2A7800   D  844         LHLD   PADMX+2   ;PLUS DELAY TO PAD EDGE
03D9  19          845         DAD    D         ;SDX
03DA  E5          846         PUSH   H
03DB  2A0800   D  847         LHLD   VEDGE+SHORT ;1/2 DELAY FOR PAD HTH
03DE  CD0000   E  848         CALL   DHALF
03E1  EB          849         XCHG
03E2  2A7A00   D  850         LHLD   PADMX+4
03E5  19          851         DAD    D
03E6  3A6900   D  852         LDA    LDEDG     ;VERTICAL EDGE LEADING ?
03E9  FE01        853         CPI    1
03EB  CAEF03   C  854         JZ     VCNVR0    ;YES, 2ND EDGE IN (H,V) ORDER
03EE  E3          855         XTHL             ;NO, EXCHANGE
                  856 VCNVR0:
03EF  3A8500   D  857         LDA    TARGET    ;1ST TARGET ?
03F2  FE01        858         CPI    1
03F4  C2FF03   C  859         JNZ    VCNVR2    ;NO
03F7  220000   E  860         SHLD   SDY1      ;YES
03FA  E1          861         POP    H
03FB  220000   E  862         SHLD   SDX1
03FE  C9          863         RET
03FF  220000   E  864 VCNVR2: SHLD   SDY2
0402  E1          865         POP    H
0403  220000   E  866         SHLD   SDX2
```

```
LOC  OBJ          SEQ         SOURCE STATEMENT

0406 C9           867         RET
                  868
                  869
                  870
                  871
                  872  ;SETE1 START EDGE1
                  873  SETE1:
0407 3E01         874         MVI     A,1
0409 2A6300   D   875         LHLD    REDGE
040C CD4004   C   876         CALL    SETE        ;A,HL SET UP
040F 3A8200   D   877         LDA     VPASS
0412 A7           878         ANA     A           ;1ST TIME FOR EDGE 1 ?
0413 3E01         879         MVI     A,1
0415 328200   D   880         STA     VPASS       ;(RESET FOR E2)
0418 C9           881         RET
                  882
                  883
                  884
                  885  ;SETE2 START EDGE2
                  886  SETE2:
0419 3E02         887         MVI     A,2
041B 2A6500   D   888         LHLD    REDGE+2
041E CD4004   C   889         CALL    SETE
0421 2A6100   D   890         LHLD    CONDLY      ;GET LAST DELAY 1ST EDGE
0424 220200   D   891         SHLD    VEDGE+DLYCON
0427 3A8200   D   892         LDA     VPASS
042A FE01         893         CPI     1           ;USE LAST E1 DELAY ?
042C C0           894         RNZ                 ;NO
042D 2A5F00   D   895         LHLD    REDLY       ;YES
0430 221400   D   896         SHLD    VEDGE+NUDLY
0433 3C           897         INR     A
0434 328200   D   898         STA     VPASS
0437 3A8500   D   900         LDA     TARGET
043A FE01         901         CPI     1           ;TARGET 1 ?
043C C48105   C   902         CNZ     STDLY2      ;NO, CALCULATE EDGE 2 DELAYS
043F C9           904         RET
                  905
                  906
                  907
                  908
                  909
                  910  $EJECT
                  911  ;SETE   SET UP NEDGE,MOVE IN EDGE PARAMETERS TO VEDGE
                  912  ;       ENTER: (A) = NEW EDGE CTL
                  913  ;              (HL)= ADDR OF VERT OR HORIZ PARAMETERS
                  914  ;
                  915  SETE:
0440 328300   D   916         STA     NEDGE
0443 227C00   D   917         SHLD    NUEDGE
0446 110000   D   918         LXI     D,VEDGE
0449 EB           919         XCHG
044A 011B00       920         LXI     B,NVLST
044D CD0000   E   921         CALL    MOVE        ;MOVE IN NEW EDGE PARAMETERS
0450 C9           922         RET
                  923
```

```
LOC  OBJ          SEQ        SOURCE STATEMENT 924
                  925
                  926
                  927  ;SVEDG SAVE CURRENT DELAYS FOR LATER USE
                  928  ;     CALLED BY 'EDGE1','EDGE2'
                  929  SVEDG:
0451 2A0400  D    930        LHLD    VEDGE+DELAY     ;SAVE CURRENT DELAY
0454 221600  D    931        SHLD    VEDGE+OLDLY
0457 2A7C00  D    932        LHLD    NUEDGE          ;ADDR OF EDGE BUFFER IN USE
045A 111400       933        LXI     D,NUDLY
045D 19           934        DAD     D
045E 111400  D    935        LXI     D,VEDGE+NUDLY
0461 010400       936        LXI     B,4             ;SAVE NEXT DELAY,AVG CT
0464 CD0000  E    937        CALL    MOVE
0467 C9           938        RET
                  939
                  940
                  941
                  942  ;SETPD INITIALIZE FOR PAD TESTS
                  943  ;     AND START PAD1
                  944  SETPD:
0468 3E03         945        MVI     A,3
046A 328300  D    946        STA     NEDGE
046D 2A0000  D    947        LHLD    VEDGE+VOUT      ;SAVE ADDR(CURRENT I/O LIST)
0470 227E00  D    948        SHLD    PADOUT
                  949  SETPD1:
0473 CD8904  C    950        CALL    PADIN           ;ADJUST PAD DELAYS FOR OFFSETS
                  951  SETPD2:
0476 2A7E00  D    952        LHLD    PADOUT
0479 220000  D    953        SHLD    VEDGE+VOUT
047C 210200  D    954        LXI     H,VEDGE+DLYCON
047F 115100  D    955        LXI     D,PADLY
0482 010800       956        LXI     B,8             ;MOVE IN PAD DELAYS, ZONE
0485 CD0000  E    957        CALL    MOVE
0488 C9           958        RET
                  959
                  960
                  961  $EJECT
                  962  ;PADIN FIX DELAYS USING OFFSET
                  963  ;
                  964  PADIN:
0489 3A6900  D    965        LDA     LDEDG           ;V-EDGE LEADS ?
048C FE01         966        CPI     1
048E C29E04  C    967        JNZ     PADINV          ;NO, IS 2ND
0491 2A5B00  D    968        LHLD    PADOFF          ;H-EDGE: ADJ FOR PAD OFFSETS
0494 CDAB04  C    969        CALL    PDCON
0497 2A5D00  D    970        LHLD    PADOFF+2
049A CDB704  C    971        CALL    PDVAR
049D C9           972        RET
                  973  PADINV:
049E 2A5D00  D    974        LHLD    PADOFF+2
04A1 CDAB04  C    975        CALL    PDCON
04A4 2A5B00  D    976        LHLD    PADOFF
04A7 CDB704  C    977        CALL    PDVAR
04AA C9           978        RET
```

```
LOC  OBJ           SEQ         SOURCE STATEMENT 979
                   980 PDCON:
04AB EB            981         XCHG
04AC 2A0200    D   982         LHLD    VEDGE+DLYCON
04AF 19            983         DAD     D
04B0 220200    D   984         SHLD    VEDGE+DLYCON
04B3 225100    D   985         SHLD    PADLY
04B6 C9            986         RET
                   987
                   988 PDVAR:
04B7 EB            989         XCHG
04B8 2A0400    D   990         LHLD    VEDGE+DELAY
04BB 19            991         DAD     D
04BC 220400    D   992         SHLD    VEDGE+DELAY
04BF 225300    D   993         SHLD    PADLY+2
04C2 C9            994         RET
                   995
                   996 $EJECT
                   997 ;PDTST    COMPARE TOTAL ZONE CTS WITH PREVIOUS MAX
                   998 ;         IF CURRENT GREATER, SAVE IT AND ITS DELAYS
                   999 ;         INCREMENT 'NEDGE'
                   1000 ;
                   1001 PDTST:
04C3 218300    D   1002        LXI     H,NEDGE ;INCR INDEX
04C6 34            1003        INR     M
                   1004 PDTST1:
04C7 2A9A00    D   1005        LHLD    DTVZC
04CA EB            1006        XCHG
04CB 2A7600    D   1007        LHLD    PADMX
04CE CD0000    E   1008        CALL    HCMPD       ;COMPARE
04D1 DCD504    C   1009        CC      SAVPD       ;NEW CT IS GREATER
04D4 C9            1010        RET
                   1011
                   1012
                   1013
                   1014 ;SAVPD SAVE MAXIMUMS FROM PAD TEST
                   1015 SAVPD:
04D5 2A9A00    D   1016        LHLD    DTVZC       ;SAVE MAX ZONE CT
04D8 227600    D   1017        SHLD    PADMX
04DB 2A0200    D   1018        LHLD    VEDGE+DLYCON ;SAVE DELAYS
04DE 227800    D   1019        SHLD    PADMX+2
04E1 2A0400    D   1020        LHLD    VEDGE+DELAY
04E4 227A00    D   1021        SHLD    PADMX+4
04E7 C9            1022        RET
                   1023
                   1024
                   1025
                   1026 $EJECT
                   1028 ;TSTBX2    TEST EDGE 2 SEARCH LIMIT
                   1029 ;         EXIT: CY = 1 IFF LIMIT REACHED
                   1030 TSTBX2:
04E8 2A5F00    D   1031        LHLD    REDLY
04EB 3A1A00    D   1032        LDA     VEDGE+QUAD  ;NEG MOTION ?
04EE A7            1033        ANA     A
04EF CAF304    C   1034        JZ      TSBX2A      ;NO
```

```
LOC  OBJ          SEQ           SOURCE STATEMENT

04F2 EB            1035             XCHG               ;YES, GO FROM LARGE TO SMALL
04F3 CD0000   E    1036 TSBX2A:   CALL HCMPD          ;COMPARE
04F6 C9            1037             RET
                   1038
                   1039 ;T2LIM SET MAX FOR 2ND TARGET PAD SEARCH
                   1040 ;     ENTER: (HL) = DELAY
                   1041 T2LIM:
04F7 3A1A00   D    1042             LDA     VEDGE+QUAD    ;NEG MOTION ??
04FA A7            1043             ANA     A
04FB CA0305   C    1044             JZ      T2LIM0        ;NO
04FE 0E09          1045             MVI     C,9           ;YES, GET 90%
0500 C30505   C    1046             JMP     T2LIM1
0503 0E0B          1047 T2LIM0:    MVI     C,11          ;NO, GET 110 %
0505 CD0000   E    1048 T2LIM1:    CALL    GETPCT        ;GET PERCENT
0508 225F00   D    1049             SHLD    REDLY
050B C9            1050             RET
                   1051
                   1053 $EJECT
                   1055
                   1056 ;GTT2E1  CALCULATE PROPER ZONE FOR 2ND EDGE SEARCH
                   1057 ;
                   1058 GTT2E1:
050C CD3005   C    1059             CALL    XLATE2        ;GET TRANSLATION
050F 2A6A00   D    1060             LHLD    DLTX
0512 EB            1061             XCHG
0513 2A6C00   D    1062             LHLD    DLTY
0516 3A6900   D    1063             LDA     LDEDG
0519 FE01          1064             CPI     1
051B CA1F05   C    1065             JZ      GT2E1V        ;VERT LEAD
051E EB            1066             XCHG
                   1067 GT2E1V:
051F E5            1068             PUSH    H
0520 2A1400   D    1069             LHLD    VEDGE+NUDLY
0523 19            1070             DAD     D
0524 221400   D    1071             SHLD    VEDGE+NUDLY
0527 D1            1072             POP     D
0528 2A0200   D    1073             LHLD    VEDGE+DLYCON
052B 19            1074             DAD     D
052C 220200   D    1075             SHLD    VEDGE+DLYCON
052F C9            1076             RET
                   1077
                   1079
                   1080 $EJECT
                   1082
                   1083 ; ;XLATE2   APPLY TARGET 1 TRANSLATION TO TARGET 2
                   1084 XLATE2:
0530 2A0000   E    1085             LHLD    PDX1          ;EXP TARGET 1 HORIZ COORD
0533 EB            1086             XCHG
0534 2A0000   E    1087             LHLD    SDX1          ;ACTUAL TARGET 1 HORIZ COORD
0537 CD0000   E    1088             CALL    DSUB          ;GET DIFF
053A E5            1089             PUSH    H
053B 2A0000   E    1090             LHLD    DLTX1         ;GET DIFF IN XY POSITION
053E EB            1091             XCHG
053F 2A0000   E    1092             LHLD    DLTX2
0542 CD0000   E    1093             CALL    DSUB
```

```
LOC  OBJ           SEQ           SOURCE STATEMENT 0545 3A0000   E   1094           LDA    VHTEN     ;CONVERT TO VIDEO UNITS
0548 CD0000   E   1095           CALL   MTOV
054B D1           1096           POP    D
054C 19           1097           DAD    D         ;SUM
054D 226A00  D   1098           SHLD   DLTX      ;SAV
0550 EB           1099           XCHG
0551 2A0000   E   1100           LHLD   PDX2      ;APPLY TO EXP TARG 2 HORIZ COOR
0554 19           1101           DAD    D
0555 220000   E   1102           SHLD   SDX2      ;FOR BEST GUESS FOR TARGET 2
0558 2A0000   E   1103           LHLD   PDY1      ;DO SAME THING FOR VERT COORD
055B EB           1104           XCHG
055C 2A0000   E   1105           LHLD   SDY1
055F CD0000   E   1106           CALL   DSUB
0562 E5           1107           PUSH   H
0563 2A0000   E   1108           LHLD   DLTY1
0566 EB           1109           XCHG
0567 2A0000   E   1110           LHLD   DLTY2
056A CD0000   E   1111           CALL   DSUB      ;DIFF IN Y POSITION
056D 3A0000   E   1112           LDA    VVTEN     ;CONVERT TO VIDEO UNITS
0570 CD0000   E   1113           CALL   MTOV
0573 D1           1114           POP    D
0574 19           1115           DAD    D         ;SUM
0575 226C00  D   1116           SHLD   DLTY      ;SAVE
0578 EB           1117           XCHG
0579 2A0000   E   1118           LHLD   PDY2
057C 19           1119           DAD    D
057D 220000   E   1120           SHLD   SDY2
0580 C9           1121           RET
                  1122
                  1123
                  1124 $EJECT
                  1125 ;STLDY2        CALCULATE EDGE 2 DELAYS FOR TARGET 2
                  1126 STDLY2:
0581 2A5700  D   1127           LHLD   PADZN+2   ;ZONE WIDTH
0584 CD0000   E   1128           CALL   DHALF     ;HALF  ZONE
0587 EB           1129           XCHG
0588 3A6900  D   1130           LDA    LDEDG     ;VERT EDGE LEADING ?
058B FE01         1131           CPI    1
058D C29605   C   1132           JNZ    STDL2A    ;NO, 2ND EDGE IS VERT
0590 2A0000   E   1133           LHLD   SDY2      ;YES
0593 C39905   C   1134           JMP    STDL2B
0596 2A0000   E   1135 STDL2A:  LHLD   SDX2
0599 EB           1136 STDL2B:  XCHG
059A 3A1A00  D   1137           LDA    VEDGE+QUAD ;POS OR NEG MOTION ?
059D A7           1138           ANA    A
059E C40000   E   1139           CNZ    DNEG       ;NEG
05A1 19           1140           DAD    D
05A2 220400  D   1141           SHLD   VEDGE+DELAY ;RESULT IS EDGE 2 DELAY
05A5 CDF704   C   1142           CALL   T2LIM      ;CALCULATE SEARCH LIMIT
05A8 CD7304   C   1143           CALL   SETPD1     ;SET PAD PARAMETERS
05AB C9           1144           RET
                  1145
                  1146 $EJECT
```

```
LOC  OBJ          SEQ         SOURCE STATEMENT 1148
                  1149
                  1150 ;VWAIT  EVENT SYNCHRONIZATION ROUTINE
                  1151 ;       FOR COMPLETION OF VIDEO SEARCH
                  1152 ;CALL FROM COMMAND LEVEL 2 ONLY
                  1153 VWAIT:
05AC D1           1154         POP    D
05AD 210000   E   1155         LXI    H,VCTL
05B0 3E01         1156         MVI    A,1
05B2 CD0000   E   1157         CALL   WAIT
05B5 C9           1158         RET
                  1159
                  1160
                  1161
                  1162 ;GETBOX  MOVE BOX INTO OUTPUT PARAMETER LISTS
                  1163 GETBOX:
05B6 3A6500   D   1164         LDA    TARGET   ;WHICH TARGET ?
05B9 FE01         1165         CPI    1
05BB 110000   E   1166         LXI    D,BOX1
05BE CAC405   C   1167         JZ GETBX         ;FIRST
05C1 110000   E   1168         LXI    D,BOX2   ;SECOND
05C4 211B00   D   1169 GETBX:  LXI    H,VRTCL
05C7 015B00       1170         LXI    B,NVLEN
05CA CD0000   E   1171         CALL   MOVE
05CD 2A6300   D   1172         LHLD   AEDGE    ;MOVE PARAM TO WORKING AREA
05D0 CD4004   C   1173         CALL   SETE
05D3 2A6700   D   1174         LHLD   BOXSID   ;BOX SIDE FROM 2ND EDGE LIST
05D6 220800   D   1175         SHLD   VEDGE+SHORT
05D9 C9           1176         RET
                  1177
                  1178
                  1179
                  1180
                  1181
                  1182 ;VCENTR  DISPLAY SCREEN CENTER
                  1183 VCENTR:
05DA 2A0000   E   1184         LHLD   VHCEN
05DD 220200   D   1185         SHLD   VEDGE+DLYCON
05E0 2A0000   E   1186         LHLD   VVCEN
05E3 220400   D   1187         SHLD   VEDGE+DELAY
05E6 217800       1188         LXI    H,120
05E9 220600   D   1189         SHLD   VEDGE+LONG
05EC 215000       1190         LXI    H,80
05EF 220800   D   1191         SHLD   VEDGE+SHORT
05F2 21FF05   C   1192         LXI    H,VOUTH  ;SET I/O LIST ADDRESS
05F5 220000   D   1193         SHLD   VEDGE
05F8 CD2800   C   1194         CALL   VCAMON   ;TURN ON VIDEO CAMERA
05FB CDDA00   C   1195         CALL   DSPZON   ;DISPATCH TO DISPLAY ZONE
05FE C9           1196         RET
                  1197
                  1198
                  1199 $EJECT
                  1200
                  1201
```

```
LOC  OBJ        SEQ       SOURCE STATEMENT

1202  ;VIDEO I/O PORT TABLE:
                1203  VOUTH:
05FF 10         1204          DB      OV1HD,OV1VD,OV1HZ,OV1VZ
0600 20
0601 18
0602 28
                1205
                1206          ;DB     OV2HD,OV2VD,OV2HZ,OV2VZ
                1207  VOUTV:
0603 20         1208          DB      OV1VD,OV1HD,OV1VZ,OV1HZ
0604 10
0605 28
0606 18
                1209          ;DB     OV2VD,OV2HD,OV2VZ,OV2HZ
                1210
                1211
                1212
                1213  $EJECT
                1214
                1215
                1216  DSEG
                1217
                1218
0000         D  1219  DVID    EQU     $
                1220
                1221
0000         D  1222  VEDGE   EQU     $
001B         D  1223  VRTCL   EQU     VEDGE+NVLST     ;VERTICAL ZONE DATA
0036         D  1224  HZNTL   EQU     VRTCL+NVLST     ;HORIZONTAL ZONE DATA
0051         D  1225  PADLY   EQU     HZNTL+NVLST     ;PAD DATA
0055         D  1226  PADZN   EQU     PADLY+4
0059         D  1227  PADMN   EQU     PADZN+4
005B         D  1228  PADOFF  EQU     PADMN+2
                1229
005F         D  1230  RAMPC   SET     PADOFF+4
                1231
                1232
005F         D  1233  REDLY   EQU     RAMPC
0061         D  1234  CONDLY  EQU     REDLY+2
0063         D  1235  AEDGE   EQU     CONDLY+2
0067         D  1236  BOXSID  EQU     AEDGE+4
0069         D  1237  LDEDG   EQU     BOXSID+2
                1238
006A         D  1239  RAMPC   SET     LDEDG+1
                1240
                1241
006A         D  1242  DLTX    EQU     RAMPC
006C         D  1243  DLTY    EQU     DLTX+2
006E         D  1244  VX      EQU     DLTY+2
0070         D  1245  VY      EQU     VX+2
0072         D  1246  PDX     EQU     VY+2
0074         D  1247  PDY     EQU     PDX+2
                1248
0076         D  1249  RAMPC   SET     PDY+2
```

```
LOC  OBJ         SEQ        SOURCE STATEMENT 1250
                 1251
                 1252 $EJECT
                 1253 ;VARIABLES GENERATED DYNAMICALLY AND USED BY
                 1254 ; SEARCH OR DISPLAY
                 1255
0076        D    1256 PADMX    EQU    RAMPC
007C        D    1257 NUEDGE   EQU    PADMX+6
007E        D    1258 PADOUT   EQU    NUEDGE+2
0080        D    1259 VFLAG    EQU    PADOUT+2
0081        D    1260 E2FLAG   EQU    VFLAG+1
                 1261
                 1262
0082        D    1263 VPASS    EQU    E2FLAG+1
0083        D    1264 NEDGE    EQU    VPASS+1
0084        D    1265 VSPFL    EQU    NEDGE+1
0085        D    1266 TARGET   EQU    VSPFL+1
                 1267
0086        D    1268 ZONCT1   EQU    TARGET+1
0088        D    1269 ZONCT2   EQU    ZONCT1+2
008A        D    1270 DTVZC    EQU    ZONCT2+2
                 1271
008C        D    1272 RAMPC    SET    DTVZC+2
                 1273
008C             1274          DS     RAMPC-DVID
                 1275
                 1276
                 1277
                 1278 ;END BNVID
                 1279 $EJECT
                 1280
                 1281
                 1282 END
```

PUBLIC SYMBOLS
| | | | |
|---|---|---|---|
| AEDGE  D 0063 | BNVID  C 0000 | BOXSID D 0067 | CONDLY D 0061 |
| DCHORZ A 0100 | DCVERT A 0079 | DLTX   D 006A | DLTY   D 006C |
| DSPZON C 00DA | DVID   D 0000 | GETBOX C 05B6 | HZNTL  D 0036 |
| INIVIO C 00B3 | LDEDG  D 0069 | PADLY  D 0051 | PADMN  D 0059 |
| PADMX  D 0076 | PADOFF D 005B | PADZN  D 0055 | PDX    D 0072 |
| PDY    D 0074 | REDLY  D 005F | SHOBOX C 00FC | TARGET D 0085 |
| VCAMOF C 0035 | VCAMON C 0028 | VCENTR C 05DA | VEDGE  D 0000 |
| VFIND  C 0106 | VIDEO  C 00C3 | VOUTH  C 05FF | VOUTV  C 0603 |
| VRTCL  D 001B | VSPFL  D 0084 | VWAIT  C 05AC | VX     D 006E |
| VY     D 0070 | VZONES C 001A | | |

EXTERNAL SYMBOLS
| | | | |
|---|---|---|---|
| ABSHD  E 0000 | ASSIST E 0000 | BOX1   E 0000 | BOX2   E 0000 |
| CKTINC E 0000 | DHALF  E 0000 | DLTX1  E 0000 | DLTX2  E 0000 |
| DLTY1  E 0000 | DLTY2  E 0000 | DNEG   E 0000 | DSUB   E 0000 |
| EVDCOD E 0000 | GETPCT E 0000 | HCMPD  E 0000 | IOACK  E 0000 |
| IODATA E 0000 | MODEIN E 0000 | MODEOU E 0000 | MOVE   E 0000 |
| MTOV   E 0000 | OCAMRA E 0000 | PDX1   E 0000 | PDX2   E 0000 |
| PDY1   E 0000 | PDY2   E 0000 | SDVRN  E 0000 | SDX1   E 0000 |
| SDX2   E 0000 | SDY1   E 0000 | SDY2   E 0000 | SETEVT E 0000 |

| | | | |
|---|---|---|---|
| SURVEY E 0000 | SYAUT E 0000 | SYSTEM E 0000 | SYVID E 0000 |
| VCMDLY E 0000 | VCTL E 0000 | VHCEN E 0000 | VHTEN E 0000 |
| VIDCAM E 0000 | VIDEV E 0000 | VINTNS E 0000 | VSBIT E 0000 |
| VSBIT1 E 0000 | VSBIT2 E 0000 | VSRV E 0000 | VVCEN E 0000 |
| VVTEN E 0000 | WAIT E 0000 | WRITE E 0000 | |

USER SYMBOLS

| | | | |
|---|---|---|---|
| ABSHD E 0000 | AEDGE D 0063 | ASSIST E 0000 | AVGCT A 0018 |
| BNVID C 0000 | BOX1 E 0000 | BOX2 E 0000 | BOXMX A 000A |
| BOXSID D 0067 | BXEDG C 038E | CKEDGE C 028B | CKTARG C 02C2 |
| CKTINC E 0000 | CONDLY D 0061 | DCHORZ A 0100 | DCVERT A 0079 |
| DELAY A 0004 | DHALF E 0000 | DINCL A 0012 | DINCS A 0010 |
| DLTX D 006A | DLTX1 E 0000 | DLTX2 E 0000 | DLTY D 006C |
| DLTY1 E 0000 | DLTY2 E 0000 | DLYCON A 0002 | DNEG E 0000 |
| DOE1 C 0141 | DOE1T2 C 0159 | DOE2 C 014A | DSPVID C 00DD |
| DSPZON C 00DA | DSUB E 0000 | DTVZC D 008A | DVID D 0000 |
| E1TO2 C 0146 | E2FLAG D 0081 | E2POSS C 018C | E2TO1 C 0155 |
| EDGE C 02FC | EDGE1 C 015F | EDGE2 C 019C | EDGSET C 02F2 |
| EDGXT C 03A3 | EVDCOD E 0000 | GETBOX C 05B6 | GETBX C 05C4 |
| GETPCT E 0000 | GT2E1Y C 051F | GTT2E1 C 050C | HCMPD E 0000 |
| HINCR A 0001 | HMIL10 A 0044 | HZNTL D 0036 | INIVIO C 00B8 |
| INTNS A 0090 | IOACK E 0000 | IODATA E 0000 | IV1ZC A 0010 |
| IV2ZC A 0058 | LDEDG D 0069 | LIMX C 033D | LONG A 0006 |
| MINAVG A 0002 | MIXZON C 003E | MODEIN E 0000 | MODEOU E 0000 |
| MOVE E 0000 | MTOV E 0000 | MVZON C 0322 | MXZONX C 009A |
| NDATA A 000C | NEDGE D 0083 | NEXPAD A 000C | NMISC A 000B |
| NOE1 C 0179 | NOE2 C 01D3 | NPAD A 000E | NUDLY A 0014 |
| NUEDGE D 007C | NVLEN A 005B | NVLEN0 A 0036 | NVLEN1 A 0025 |
| NVLST A 001B | NXTZN2 C 0366 | NXTZN3 C 0372 | NXTZNX C 037C |
| NXTZON C 0343 | OCAMRA E 0000 | OLDLY A 0016 | OV1CL A 0008 |
| OV1EX A 0030 | OV1HD A 0010 | OV1HZ A 0018 | OV1VD A 0020 |
| OV1VZ A 0028 | OV2CL A 0050 | OV2EX A 0078 | OV2HD A 0058 |
| OV2HZ A 0060 | OV2VD A 0068 | OV2VZ A 0070 | PAD1 C 01D6 |
| PAD2 C 01DD | PAD2H C 01EB | PAD2X C 01EE | PAD3 C 0204 |
| PAD3IN C 01FE | PADFIN C 02B4 | PADIN C 0489 | PADINV C 049E |
| PADLY D 0051 | PADMN D 0059 | PADMX D 0076 | PADOFF D 005B |
| PADOUT D 007E | PADXT1 C 024F | PADXT2 C 025A | PADZN D 0055 |
| PDCON C 04AB | PDTST C 04C3 | PDTST1 C 04C7 | PDVAR C 04B7 |
| PDX D 0072 | PDX1 E 0000 | PDX2 E 0000 | PDY D 0074 |
| PDY1 E 0000 | PDY2 E 0000 | POSINC C 03A2 | QUAD A 001A |
| RAMFC D 008C | RDZON C 0076 | RDZON0 C 0079 | REDLY D 005F |
| SAVPD C 04D5 | SDVRN E 0000 | SDX1 E 0000 | SDX2 E 0000 |
| SDY1 E 0000 | SDY2 E 0000 | SEARCH C 00EE | SETE C 0440 |
| SETE1 C 0407 | SETE2 C 0419 | SETEVT E 0000 | SETPD C 0468 |
| SETPD1 C 0473 | SETPD2 C 0476 | SHOBOX C 00FC | SHORT A 0008 |
| STDL2A C 0596 | STDL2B C 0599 | STDLY2 C 0581 | SURVEY E 0000 |
| SVEDG C 0451 | SYAUT E 0000 | SYSTEM E 0000 | SYVID E 0000 |
| T2LIM C 04F7 | T2LIM0 C 0503 | T2LIM1 C 0505 | T2PD3X C 027D |
| TARGET D 0085 | TEST C 0225 | TESTOK C 023F | TSBX2A C 04F3 |
| TSTBX C 0381 | TSTBX2 C 04E8 | V1ADDR C 0125 | V2ADDR C 0133 |
| VASST C 0015 | VCAMOF C 0035 | VCAMON C 0028 | VCENTR C 05DA |
| VCMDLY E 0000 | VCNVR0 C 03EF | VCNVR2 C 03FF | VCNVRT C 03CF |
| VCTL E 0000 | VEDGE D 0000 | VERROR C 0003 | VEVNT C 0188 |
| VFIND C 0106 | VFIND1 C 011C | VFIND3 C 011F | VFLAG D 0080 |
| VFOUN C 029F | VHCEN E 0000 | VHTEN E 0000 | VIDCAM E 0000 |
| VIDEO C 00C3 | VIDEV E 0000 | VINCR A 0001 | VINTNS E 0000 |

| | | | | | | | | | |
|---|---|---|---|---|---|---|---|---|---|
| VMIL10 | A 002B | VOUT | A 0000 | VOUTH | C 05FF | VOUTV | C 0603 | | |
| VPASS | D 0082 | VRTCL | D 001B | VSBIT | E 0000 | VSBIT1 | E 0000 | | |
| VSBIT2 | E 0000 | VSETUP | C 03A6 | VSFFL | D 0084 | VSRY | E 0000 | | |
| VSTUP0 | C 03CB | VSTUP2 | C 03C8 | VT1ER | A 0001 | VT2ER | A 0002 | | |
| VTIMER | C 001D | VTYPE | A 0001 | VVCEN | E 0000 | VVTEN | E 0000 | | |
| VWAIT | C 05AC | VWR1 | C 00A7 | VWRITE | C 009E | VX | D 006E | | |
| VXFR | C 0000 | VXFRER | A 0094 | VY | D 0070 | VZONES | C 001A | | |
| WAIT | E 0000 | WRITE | E 0000 | XLATE2 | C 0530 | YESE2 | C 0101 | | |
| ZONCT1 | D 0086 | ZONCT2 | D 0088 | ZONMN | A 000C | ZONMX | A 000E | | |

ASSEMBLY COMPLETE, NO ERRORS

| | | | | | | | | | |
|---|---|---|---|---|---|---|---|---|---|
| ABSHD | 31 | | | | | | | | |
| AEDGE | 13 | 875 | 888 | 1172 | 1235# | 1236 | | | |
| ASSIST | 27 | 167 | | | | | | | |
| AVGCT | 88# | 89 | 718 | 732 | | | | | |
| BNVID | 4 | 6 | 145# | | | | | | |
| BOX1 | 23 | 829 | 1166 | | | | | | |
| BOX2 | 23 | 831 | 1168 | | | | | | |
| BOXMX | 81# | 82 | 800 | | | | | | |
| BOXSID | 13 | 1174 | 1236# | 1237 | | | | | |
| BXEDG | 795 | 799# | | | | | | | |
| CKEDGE | 620# | 671 | 680 | | | | | | |
| CKTARG | 570 | 660# | | | | | | | |
| CKTINC | 20 | 193 | | | | | | | |
| CONDLY | 13 | 438 | 596 | 890 | 1234# | 1235 | | | |
| DCHORZ | 15 | 57# | | | | | | | |
| DCVERT | 15 | 58# | | | | | | | |
| DELAY | 73# | 74 | 437 | 480 | 530 | 541 | 655 | 670 | 706 | 724 |
| | 930 | 990 | 992 | 1020 | 1141 | 1187 | | | |
| DHALF | 30 | 537 | 755 | 757 | 842 | 848 | 1128 | | |
| DINCL | 85# | 86 | | | | | | | |
| DINCS | 84# | 85 | 508 | 511 | 532 | 598 | | | |
| DLTX | 9 | 1060 | 1098 | 1242# | 1243 | | | | |
| DLTX1 | 25 | 1090 | | | | | | | |
| DLTX2 | 25 | 1092 | | | | | | | |
| DLTY | 9 | 1062 | 1116 | 1243# | 1244 | | | | |
| DLTY1 | 25 | 1108 | | | | | | | |
| DLTY2 | 25 | 1110 | | | | | | | |
| DLYCON | 72# | 73 | 225 | 514 | 517 | 526 | 652 | 679 | 891 | 954 |
| | 982 | 984 | 1018 | 1073 | 1075 | 1185 | | | |
| DNEG | 31 | 536 | 539 | 688 | 721 | 1139 | | | |
| DOE1 | 365 | 388# | 415 | | | | | | |
| DOE1T2 | 376 | 413# | | | | | | | |
| DOE2 | 366 | 397# | | | | | | | |
| DSPVID | 294 | 308# | | | | | | | |
| DSPZON | 14 | 302# | 333 | 1195 | | | | | |
| DSUB | 30 | 802 | 1088 | 1093 | 1106 | 1111 | | | |
| DTVZC | 249 | 710 | 1005 | 1016 | 1270# | 1272 | | | |
| DVID | 6 | 1219# | 1274 | | | | | | |
| E1T02 | 392# | 582 | | | | | | | |
| E2FLAG | 468 | 823 | 1260# | 1263 | | | | | |
| E2POSS | 467 | 475# | | | | | | | |
| E2T01 | 401 | 404# | | | | | | | |
| EDGE | 430 | 462 | 705# | | | | | | |
| EDGE1 | 389 | 429# | 435 | | | | | | |

| Name | | | | | | | | | |
|---|---|---|---|---|---|---|---|---|---|
| EDGE2 | 398 | 461# | 470 | 473 | | | | | |
| EDGSET | 667 | 676 | 684# | | | | | | |
| EDGXT | 809 | 811# | | | | | | | |
| EVDCOD | 27 | 160 | | | | | | | |
| GETBOX | 14 | 332 | 1163# | | | | | | |
| GETBX | 832 | 1167 | 1169# | | | | | | |
| GETPCT | 30 | 625 | 1048 | | | | | | |
| GT2E1V | 1065 | 1067# | | | | | | | |
| GTT2E1 | 414 | 1058# | | | | | | | |
| HCMPD | 30 | 245 | 558 | 627 | 735 | 761 | 769 | 776 | 1008 | 1036 |
| HINCP | 50# | | | | | | | | |
| HMIL10 | 54# | | | | | | | | |
| HZNTL | 11 | 511 | 1224# | 1225 | | | | | |
| INIVIO | 14 | 276# | | | | | | | |
| INTNS | 136# | | | | | | | | |
| IOACK | 29 | 214 | 234 | | | | | | |
| IODATA | 29 | 220 | 223 | 239 | 243 | 262 | 278 | | |
| IV1ZC | 124# | 242 | | | | | | | |
| IV2ZC | 133# | 238 | | | | | | | |
| LDEDG | 13 | 505 | 852 | 965 | 1063 | 1130 | 1237# | 1239 | |
| LINX | 731 | 737# | | | | | | | |
| LONG | 74# | 75 | 841 | 1189 | | | | | |
| MINAVG | 139# | 752 | | | | | | | |
| MIXZON | 180 | 208# | | | | | | | |
| MODEIN | 29 | 233 | | | | | | | |
| MODEOU | 29 | 209 | 277 | | | | | | |
| MOVE | 30 | 921 | 937 | 957 | 1171 | | | | |
| MTOV | 28 | 1095 | 1113 | | | | | | |
| MVZON | 722# | | | | | | | | |
| MXZONX | 246 | 248# | | | | | | | |
| NDATA | 78# | | | | | | | | |
| NEDGE | 340 | 916 | 946 | 1002 | 1264# | 1265 | | | |
| NEXPAD | 95# | 98 | | | | | | | |
| NMISC | 94# | 98 | | | | | | | |
| NOE1 | 433 | 441# | 583 | 611 | 613 | | | | |
| NOE2 | 465 | 487# | | | | | | | |
| NPAD | 93# | 98 | | | | | | | |
| NUDLY | 86# | 87 | 705 | 726 | 896 | 933 | 935 | 1069 | 1071 |
| NUEDGE | 917 | 932 | 1257# | 1258 | | | | | |
| NVLEN | 100# | 1170 | | | | | | | |
| NVLEN0 | 97# | 100 | | | | | | | |
| NVLEN1 | 98# | 100 | | | | | | | |
| NVLST | 91# | 97 | 97 | 920 | 1223 | 1224 | 1225 | | |
| NXTZN2 | 762 | 767# | | | | | | | |
| NXTZN3 | 770 | 774# | | | | | | | |
| NXTZNX | 754 | 766 | 773 | 779 | 781# | | | | |
| NXTZON | 719 | 750# | | | | | | | |
| OCAMRA | 19 | 189 | 191 | 199 | 202 | | | | |
| OLDLY | 87# | 88 | 931 | | | | | | |
| OV1CL | 118# | 221 | 269 | 279 | | | | | |
| OV1EX | 123# | 230 | | | | | | | |
| OV1HD | 119# | 124 | 1204 | 1208 | | | | | |
| OV1HZ | 120# | 1204 | 1208 | | | | | | |
| OV1VD | 121# | 1204 | 1208 | | | | | | |
| OV1VZ | 122# | 1204 | 1208 | | | | | | |
| OV2CL | 127# | 224 | 269 | 280 | | | | | |

| | | | | | | | | | |
|---|---|---|---|---|---|---|---|---|---|
| OV2EX | 132# | 231 | | | | | | | |
| OV2HD | 128# | 133 | | | | | | | |
| OV2HZ | 129# | | | | | | | | |
| OV2VD | 130# | | | | | | | | |
| OV2VZ | 131# | | | | | | | | |
| PAD1 | 367 | 377 | 496# | | | | | | |
| PAD2 | 368 | 369 | 378 | 379 | 380 | 504# | | | |
| PAD2H | 507 | 510# | | | | | | | |
| PAD2X | 509 | 512# | | | | | | | |
| PAD3 | 529# | | | | | | | | |
| PAD3IN | 524# | | | | | | | | |
| PADFIN | 569 | 628 | 650# | | | | | | |
| PADIN | 950 | 964# | | | | | | | |
| PADINV | 967 | 973# | | | | | | | |
| PADLY | 12 | 525 | 597 | 600 | 602 | 955 | 985 | 993 | 1225# | 1226 |
| PADMN | 12 | 555 | 623 | 1227# | 1228 | | | | |
| PADMX | 12 | 557 | 651 | 654 | 668 | 677 | 825 | 844 | 858 | 1007 |
| | 1017 | 1019 | 1021 | 1256# | 1257 | | | | |
| PADOFF | 12 | 664 | 673 | 968 | 970 | 974 | 976 | 1228# | 1230 |
| PADOUT | 948 | 952 | 1258# | 1259 | | | | | |
| PADXT1 | 370 | 371 | 578# | | | | | | |
| PADXT2 | 381 | 382 | 592# | | | | | | |
| PADZN | 12 | 666 | 675 | 1127 | 1226# | 1227 | | | |
| PDCON | 969 | 975 | 980# | | | | | | |
| PDTST | 498 | 519 | 543 | 1001# | | | | | |
| PDTST1 | 1004# | | | | | | | | |
| PDVAR | 971 | 977 | 988# | | | | | | |
| PDX | 9 | 1246# | 1247 | | | | | | |
| PDX1 | 24 | 1085 | | | | | | | |
| PDX2 | 24 | 1100 | | | | | | | |
| PDY | 9 | 1247# | 1249 | | | | | | |
| PDY1 | 24 | 1103 | | | | | | | |
| PDY2 | 24 | 1118 | | | | | | | |
| POSINC | 806 | 810# | | | | | | | |
| QUAD | 89# | 91 | 533 | 685 | 782 | 793 | 803 | 1032 | 1042 | 1137 |
| RAMPC | 1230# | 1233 | 1239# | 1242 | 1249# | 1256 | 1272# | 1274 | |
| RDZON | 232# | | | | | | | | |
| RDZON0 | 234# | 237 | | | | | | | |
| REDLY | 13 | 481 | 895 | 1031 | 1049 | 1233# | 1234 | | |
| SAVPD | 1009 | 1015# | | | | | | | |
| SDVRN | 30 | 714 | | | | | | | |
| SDX1 | 24 | 862 | 1087 | | | | | | |
| SDX2 | 24 | 866 | 1102 | 1135 | | | | | |
| SDY1 | 24 | 860 | 1105 | | | | | | |
| SDY2 | 24 | 864 | 1120 | 1133 | | | | | |
| SEARCH | 320# | 324 | | | | | | | |
| SETE | 876 | 889 | 915# | 1173 | | | | | |
| SETE1 | 297 | 405 | 873# | | | | | | |
| SETE2 | 393 | 593 | 886# | | | | | | |
| SETEVT | 28 | 164 | | | | | | | |
| SETPD | 402 | 944# | | | | | | | |
| SETPD1 | 949# | 1143 | | | | | | | |
| SETPD2 | 606 | 951# | | | | | | | |
| SHOBOX | 10 | 331# | | | | | | | |
| SHORT | 75# | 78 | 81 | 712 | 753 | 796 | 847 | 1175 | 1191 |
| STDL2A | 1132 | 1135# | | | | | | | |

| | | | | | | | | | |
|---|---|---|---|---|---|---|---|---|---|
| STDL2B | 1134 | 1136# | | | | | | | |
| STDLY2 | 902 | 1126# | | | | | | | |
| SURVEY | 19 | | | | | | | | |
| SVEDG | 436 | 476 | 929# | | | | | | |
| SVAUT | 28 | 162 | | | | | | | |
| SYSTEM | 28 | 161 | 312 | 314 | 450 | 452 | 639 | 642 | |
| SYVID | 29 | 313 | 451 | 640 | 641 | | | | |
| T2LIM | 1041# | 1142 | | | | | | | |
| T2LIM0 | 1044 | 1047# | | | | | | | |
| T2LIM1 | 1046 | 1048# | | | | | | | |
| T2PD3X | 605 | 608# | | | | | | | |
| TARGET | 11 | 290 | 347 | 444 | 661 | 817 | 826 | 857 | 900 | 1164 |
| | 1266# | 1268 | | | | | | | |
| TEST | 554# | 579 | 594 | 612 | | | | | |
| TESTOK | 474 | 564 | 568# | | | | | | |
| TSBX2A | 1034 | 1036# | | | | | | | |
| TSTBX | 707 | 791# | | | | | | | |
| TSTBX2 | 604 | 1030# | | | | | | | |
| V1ADDR | 355 | 364# | | | | | | | |
| V2ADDR | 350 | 375# | | | | | | | |
| VASST | 163 | 166# | | | | | | | |
| VCAMOF | 8 | 198# | 449 | | | | | | |
| VCAMON | 8 | 188# | 295 | 334 | 1194 | | | | |
| VCENTR | 15 | 1183# | | | | | | | |
| VCMDLY | 22 | 192 | | | | | | | |
| VCNVR0 | 854 | 856# | | | | | | | |
| VCNVR2 | 859 | 864# | | | | | | | |
| VCNVRT | 573 | 840# | | | | | | | |
| VCTL | 32 | 311 | 322 | 454 | 636 | 1155 | | | |
| VEDGE | 12 | 210 | 225 | 437 | 480 | 514 | 517 | 526 | 530 | 532 |
| | 533 | 541 | 598 | 652 | 655 | 670 | 679 | 685 | 705 | 706 |
| | 712 | 718 | 724 | 726 | 732 | 734 | 753 | 759 | 782 | 793 |
| | 796 | 800 | 803 | 841 | 847 | 891 | 896 | 918 | 930 | 931 |
| | 935 | 947 | 953 | 954 | 982 | 984 | 990 | 992 | 1018 | 1020 |
| | 1032 | 1042 | 1069 | 1071 | 1073 | 1075 | 1137 | 1141 | 1175 | 1185 |
| | 1187 | 1189 | 1191 | 1193 | 1222# | 1223 | | | | |
| VERROR | 158# | 455 | | | | | | | |
| VEVNT | 446 | 448# | | | | | | | |
| VFIND | 14 | 293 | 321 | 339# | | | | | |
| VFIND1 | 349 | 354# | | | | | | | |
| VFIND3 | 351 | 356# | | | | | | | |
| VFLAG | 471 | 561 | 566 | 609 | 819 | 1259# | 1260 | | |
| VFOUN | 574 | 634# | | | | | | | |
| VHCEN | 21 | 1184 | | | | | | | |
| VHTEN | 21 | 1094 | | | | | | | |
| VIDCAM | 19 | 190 | 200 | 201 | | | | | |
| VIDEO | 10 | 289# | | | | | | | |
| VIDEV | 27 | 159 | 442 | | | | | | |
| VINCR | 51# | | | | | | | | |
| VINTNS | 22 | 219 | 222 | | | | | | |
| VMIL10 | 55# | | | | | | | | |
| VOUT | 71# | 72 | 210 | 947 | 953 | | | | |
| VOUTH | 11 | 1192 | 1203# | | | | | | |
| VOUTV | 11 | 1207# | | | | | | | |
| VPASS | 477 | 483 | 822 | 877 | 880 | 892 | 898 | 1263# | 1264 |
| VRTCL | 11 | 508 | 1169 | 1223# | 1224 | | | | |

| | | | | | | | | | |
|---|---|---|---|---|---|---|---|---|---|
| VSBIT | 18 | 215 | 216 | 235 | 236 | | | | |
| VSBIT1 | 18 | | | | | | | | |
| VSBIT2 | 18 | | | | | | | | |
| VSETUP | 296 | 815# | | | | | | | |
| VSPFL | 10 | 176 | 292 | 1265# | 1266 | | | | |
| VSRV | 32 | 309 | 638 | | | | | | |
| VSTUP0 | 830 | 832# | | | | | | | |
| VSTUP2 | 829 | 831# | | | | | | | |
| VT1ER | 111# | 443 | | | | | | | |
| VT2ER | 112# | | | | | | | | |
| VTIMER | 177# | 184 | | | | | | | |
| VTYPE | 47# | 346 | 374 | 409 | 586 | 816 | 899 | 1027 | 1054 | 1081 |
| VVCEN | 21 | 1186 | | | | | | | |
| VVTEN | 21 | 1112 | | | | | | | |
| VWRIT | 14 | 1153# | | | | | | | |
| VWR1 | 264# | | | | | | | | |
| VWRITE | 226 | 227 | 228 | 229 | 256# | | | | |
| VX | 9 | 1244# | 1245 | | | | | | |
| VXFR | 151# | 217 | | | | | | | |
| VXFRER | 113# | 152 | | | | | | | |
| VY | 9 | 1245# | 1246 | | | | | | |
| VZONES | 10 | 175# | 303 | 497 | 518 | 542 | 621 | 637 | 709 |
| WAIT | 32 | 1157 | | | | | | | |
| WRITE | 29 | 267 | 268 | 270 | 271 | | | | |
| XLATE2 | 1059 | 1084# | | | | | | | |
| YESE2 | 479 | 484# | | | | | | | |
| ZONCT1 | 244 | 1268# | 1269 | | | | | | |
| ZONCT2 | 240 | 1269# | 1270 | | | | | | |
| ZONMN | 82# | 83 | 759 | | | | | | |
| ZONMX | 83# | 84 | 734 | | | | | | |

CROSS REFERENCE COMPLETE

What is claimed is:
1. Automatic lead bonding apparatus comprising:
a carriage carrying a bonding head and a video scanning head;
first and second traversing means for controllably traversing said carriage on respective orthagonal axes, designated x and y, said bonding head and said video scanning head being offset in the x-y plane;
means for holding a workpiece to be bonded at an essentially predetermined work location, said traversing means being operable to initially position said video scanning head in alignment with said work location, the video scanning head being then operative to scan a workpiece held at said location and to generate a video signal corresponding to the characteristics of the workpiece, target areas on said workpiece being distinguishable in brightness;
means for generating a zone signal defining, within the scanned area, a limited zone of consideration;
means for evaluating said video signal as a function of said zone signal to measure the extent of coincidence between said zone and a target area traversed by said scan;
means for progressively adjusting said zone responsive to said evaluation and in accordance with a predetermined search algorithm to locate at least first and second target areas within said scan area and to determine the actual x-y coordinates of those target areas;
means for calculating, from the actual coordinates of said located target areas, a series of adjusted bonding positions; and
means for traversing said carriage to position said bonding head over said adjusted bonding positions successively and, at each position, effecting lead bonding.
2. Apparatus as set forth in claim 1 also including a level detector having a preselectable threshold for determining when said video signal meets a preselected brightness criteria.
3. Apparatus as set forth in claim 2 also including a high frequency clock signal source and gate means controlled by said level detector for passing clock pulses when said video signal meets said brightness criteria.
4. Apparatus as set forth in claim 3 wherein said evluating means includes a counter which responds to the clock signal selectively passed by said gate means and which is selectively enabled by said zone signal so that, on each scan, said counter is advanced by a value essentially proportional to the extent of coincidence between said zone and target area traversed by the scan.
5. Apparatus as set forth in claim 1 wherein said apparatus includes a high frequency clock signal source and means for counting down from the clock signal for providing timing signals corresponding to transitions in the video scan performed by said scanning head; and wherein said zone signal generating means includes presettable counter means for counting down said clock and timing signals to generate signals representing scan lines traversing the zone and the time, within each such line, when the scan is within the zone.

6. Automatic lead bonding apparatus comprising:

a carriage carrying a bonding head and a video scanning head;

a high frequency clock signal source;

means for counting down said clock signal to generate horizontal and vertical synchronizing signals for synchronizing the operation of said video scanning head;

first and second traversing means for controllably traversing said carriage on respective orthagonal axes, designated x and y, said bonding head and said video scanning head being offset in the x-y plane;

means for holding a workpiece to be bonded at an essentially predetermined work location, said traversing means being operable to initially position said video scanning head in alignment with said work location, the video scanning head being then operative to scan a workpiece held at said location and to generate a video signal corresponding to the characteristics of the workpiece, target areas on said workpiece being distinguishable in brightness;

a level detector responsive to said video signal and having a preselectable threshold value for determining when said video signal meets a corresponding preselected brightness criteria;

gate means controlled by said level detector for passing said clock signal when said video signal meets said brightness criteria;

zone control means including presettable vertical parameter counters responsive to said synchronizing signals, presettable horizontal parameter counters responsive to said high frequency clock signal, and means interconnected with said vertical and horizontal parameter counters for generating a zone signal when the video scan is within a limit zone of consideration determined by the values entered into said counters;

evaluation means including a counter which is enabled by said zone signal which is responsive to the clock signal passed by said gate means so that, on each scan, said counter is advanced by a value essentially proportional to the extent of coincidence between said zone and target area traversed by the scan;

means for progressively adjusting said zone responsive to said evaluation and in accordance with a predetermined search algorithm to locate at least first and second target areas within said scan area and to determine the actual x-y coordinates of those target areas;

means for calculating, from the actual coordinates of said located target areas, a series of adjusted bonding positions; and means for traversing said carriage to position said bonding head over said adjusted bonding positions successively and, at each position, effecting lead bonding.

* * * * *